(12) United States Patent
Lee et al.

(10) Patent No.: US 12,507,571 B2
(45) Date of Patent: Dec. 23, 2025

(54) DISPLAY DEVICE INCLUDING A FIRST CAPPING LAYER DISPOSED ON A LIGHT-EMITTING ELEMENT

(71) Applicant: LG Display Co., Ltd., Seoul (KR)

(72) Inventors: Eunhyung Lee, Paju-si (KR); Younghun Han, Paju-si (KR); KwangJong Kim, Paju-si (KR); Ji Hun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 472 days.

(21) Appl. No.: 17/993,100

(22) Filed: Nov. 23, 2022

(65) Prior Publication Data

US 2023/0200185 A1 Jun. 22, 2023

(30) Foreign Application Priority Data

Dec. 20, 2021 (KR) ........................ 10-2021-0183180

(51) Int. Cl.
| | |
|---|---|
| *H01L 29/08* | (2006.01) |
| *H10K 59/131* | (2023.01) |
| *H10K 59/35* | (2023.01) |
| *H10K 59/65* | (2023.01) |
| *H10K 59/80* | (2023.01) |

(52) U.S. Cl.
CPC ........... *H10K 59/65* (2023.02); *H10K 59/131* (2023.02); *H10K 59/353* (2023.02); *H10K 59/879* (2023.02)

(58) Field of Classification Search
CPC .... H10K 59/65; H10K 59/353; H10K 59/131; H10K 59/858
USPC ........................................................ 257/40
See application file for complete search history.

(56) References Cited

U.S. PATENT DOCUMENTS

| | | | |
|---|---|---|---|
| 8,421,097 | B2 | 4/2013 | Jeong et al. |
| 11,239,290 | B2 | 2/2022 | Jang et al. |
| 2011/0084291 | A1 | 4/2011 | Jeong et al. |
| 2019/0207132 | A1 | 7/2019 | Park et al. |
| 2021/0083019 | A1* | 3/2021 | Jang ...................... H10K 59/65 |

FOREIGN PATENT DOCUMENTS

| | | | |
|---|---|---|---|
| KR | 10-2011-0039056 A | | 4/2011 |
| KR | 20160032970 A | * | 3/2016 |
| KR | 10-2019-0081854 A | | 7/2019 |
| KR | 10-2021-0032599 A | | 3/2021 |
| KR | 10-2021-0147390 A | | 12/2021 |
| WO | WO-2018086352 A1 | * | 5/2018 ......... H01L 25/0753 |

OTHER PUBLICATIONS

Cite the machine translation Chen X (WO-2018086352-A1).*
Cite the machine translation Koo W (KR-20160032970-A).*
Korean Intellectual Property Office, Office Action, Korean Patent Application No. 10-2021-0183180, Nov. 8, 2024, eight pages, (with concise explanation of relevance).
Korean Intellectual Property Office, Notice of Allowance, Korean Patent Application No. 10-2021-0183180, Aug. 21, 2025, five pages.

* cited by examiner

*Primary Examiner* — Phuc T Dang
(74) *Attorney, Agent, or Firm* — Fenwick & West LLP

(57) ABSTRACT

The present disclosure relates to a display device including a first capping layer and enabling a first optical area to have a higher transmittance by designing the first optical area such that at least one of thicknesses and refractive indexes of respective portions of the first capping layer in the first optical area and the normal area is different from each other.

17 Claims, 20 Drawing Sheets

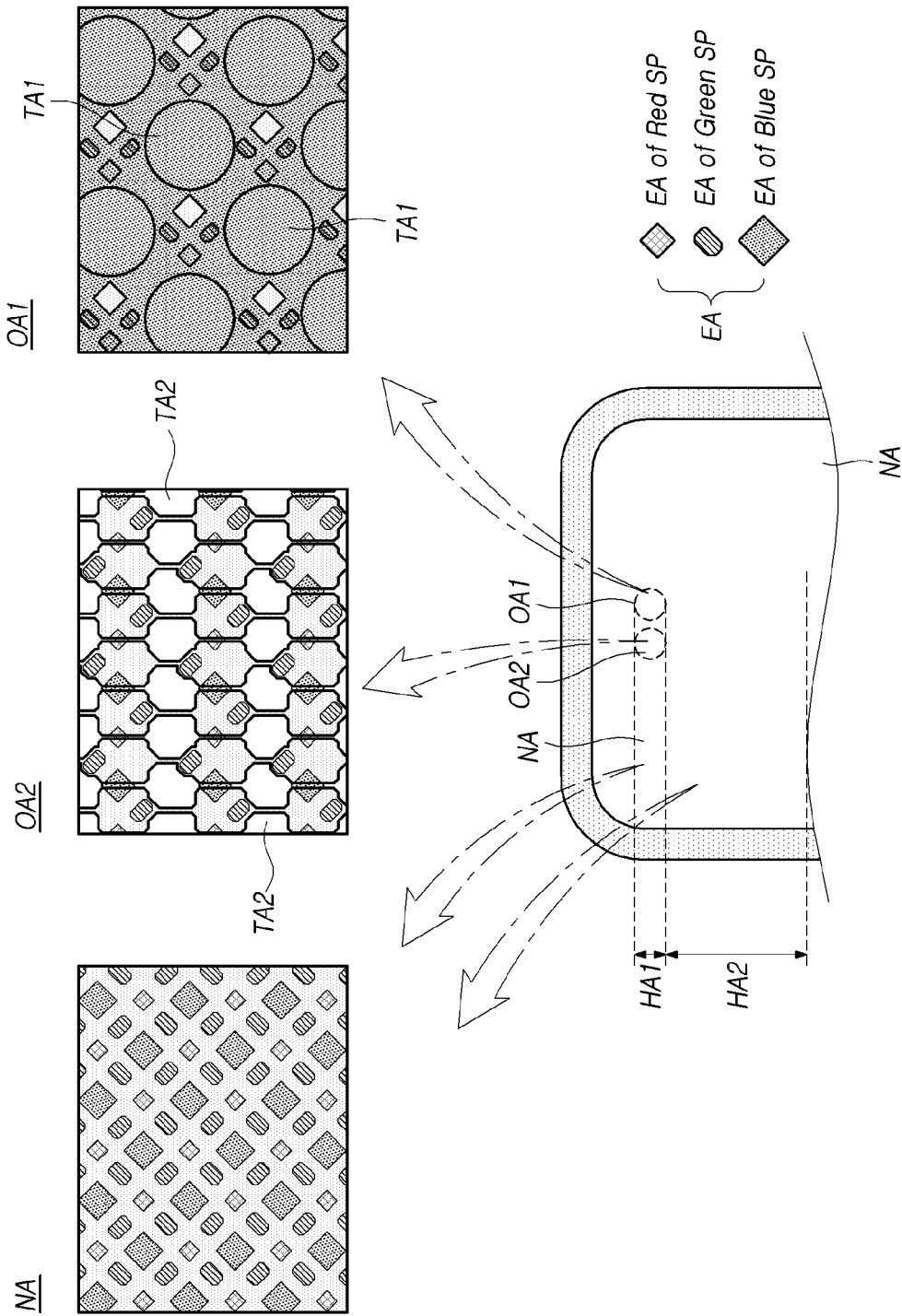

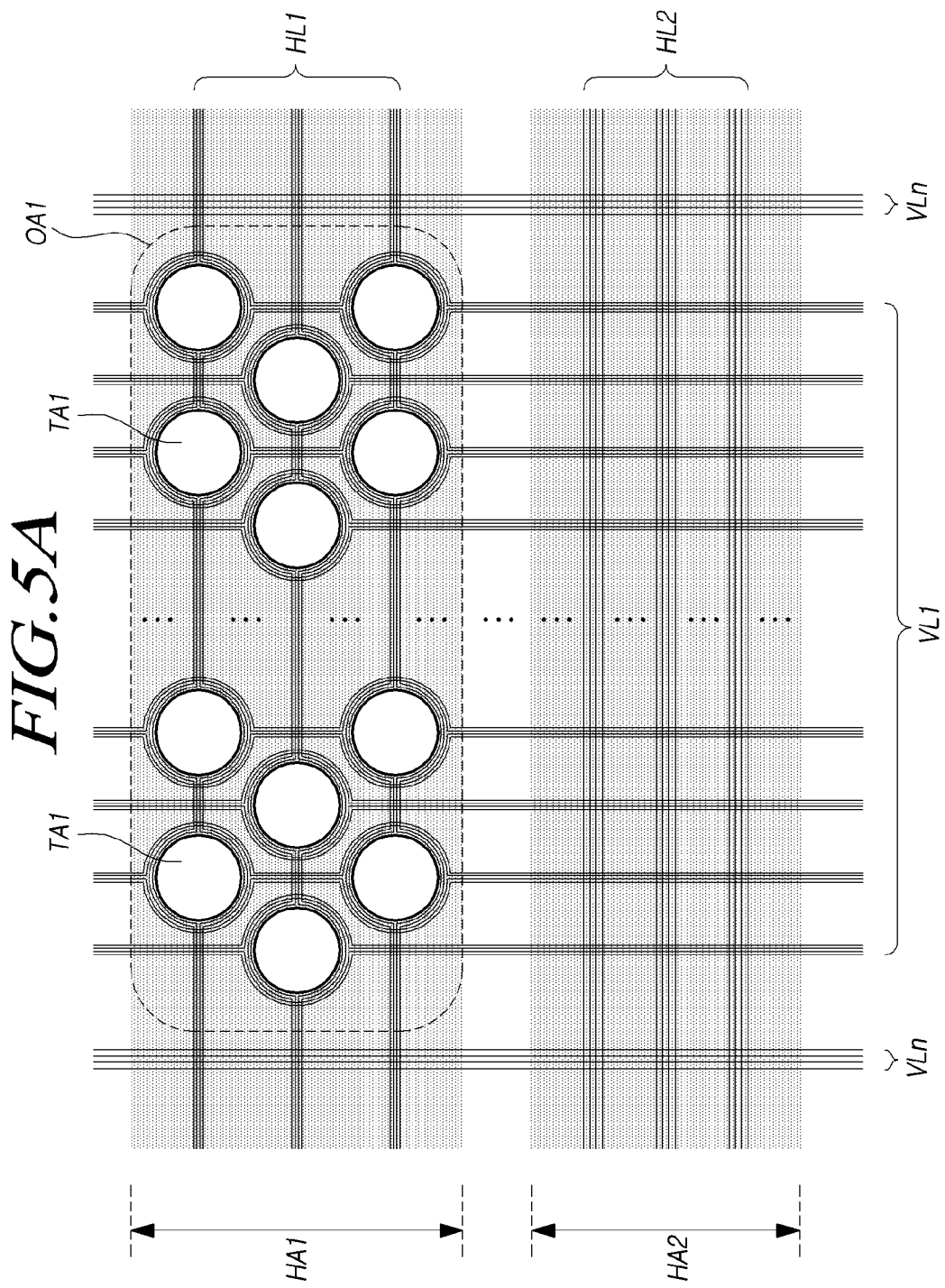

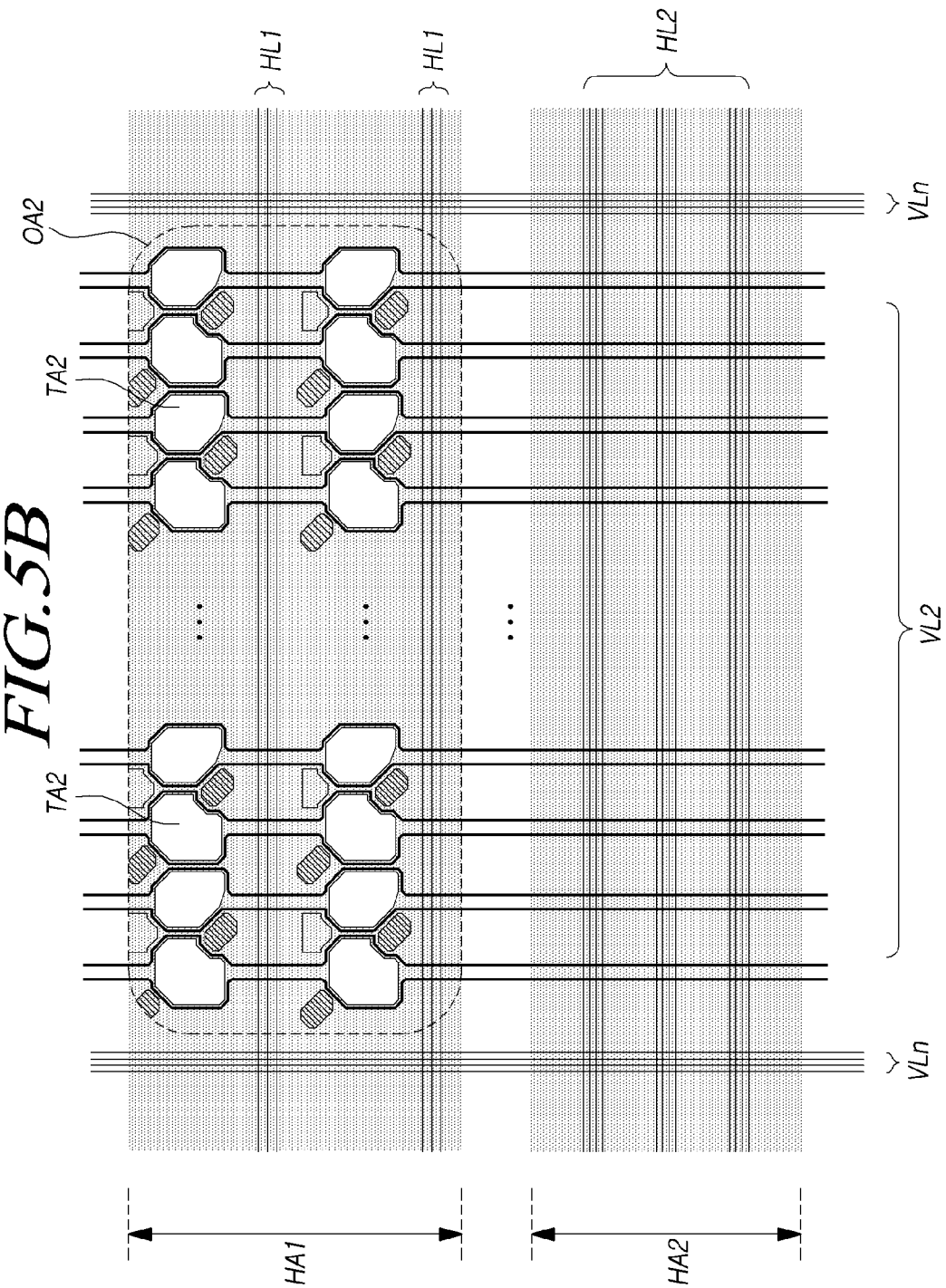

FIG. 16
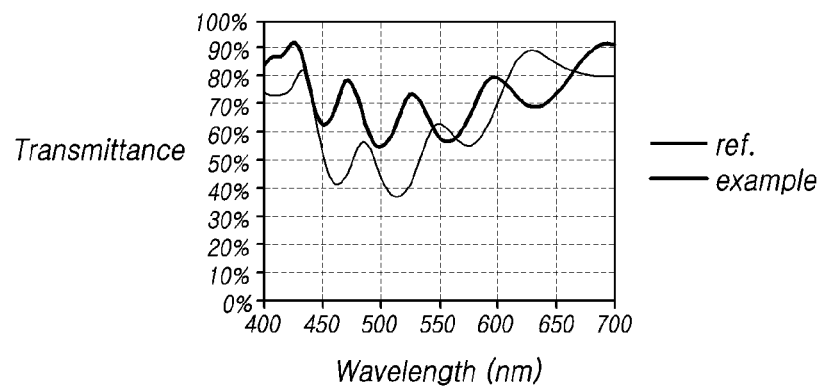
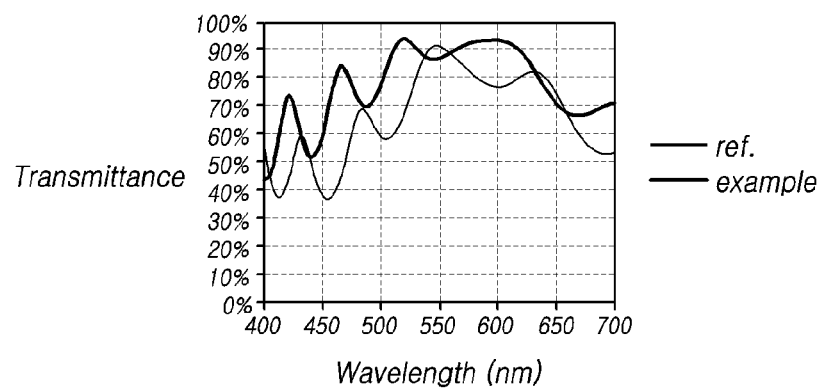
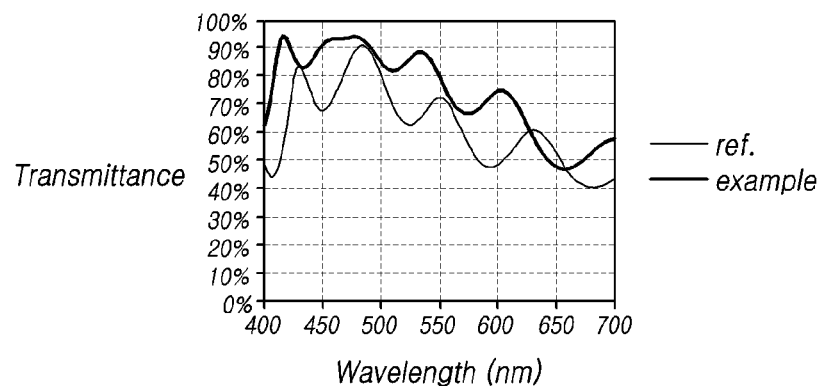

DISPLAY DEVICE INCLUDING A FIRST CAPPING LAYER DISPOSED ON A LIGHT-EMITTING ELEMENT

CROSS-REFERENCE TO RELATED APPLICATION

This application claims the priority benefit of Republic of Korea Patent Application No. 10-2021-0183180, filed on Dec. 20, 2021 in the Korean Intellectual Property Office, which is hereby incorporated by reference in its entirety.

BACKGROUND

Technical Field

The present disclosure relates to electronic devices, and more specifically, to display devices.

Description of the Related Art

As display technology advances, display devices can provide increased functions, such as an image capture function, a sensing function, and the like, as well as an image display function. To provide these functions, a display device may need to include an optical electronic device, such as a camera, a sensor for detecting an image, and the like.

In order to receive light passing through a front surface of a display device, it may be desirable for an optical electronic device to be located in an area of the display device where incident light coming from the front surface can be advantageously received or detected. Thus, in such a display device, an optical electronic device may be located in a front portion of the display device to allow the optical electronic device to be effectively exposed to incident light. In order to install the optical electronic device in such an implementation, an increased bezel of the display device may be designed, or a notch or a hole may be formed in a display area of a display panel of the display device.

Therefore, as a display device needs an optical electronic device to receive or detect incident light, and perform an intended function, a size of the bezel in the front portion of the display device may be increased, or a substantial limitation may be encountered in designing the front portion of the display device.

SUMMARY

Techniques are described for providing or placing one or more optical electronic devices in a display device without reducing an area of a display area of a display panel of the display device. In one embodiment, a display device including a light transmission structure in which even when an optical electronic device is located under a display area of a display panel is not exposed in the front surface of the display device, the optical electronic device can normally and properly receive or detect light.

One or more embodiments of the present disclosure may provide a display device including a display area including a first optical area having an excellent transmittance by designing the display area to include the first optical area and a normal area located outside of the first optical area.

One or more embodiments of the present disclosure may provide a display device capable of enabling a first optical area to have an excellent transmittance even when an electrode of a light emitting element located in the first optical area does not have a small thickness, by including a first capping layer located over the light emitting element and allowing one or more of the thicknesses and refractive indexes of respective portions of a first capping layer located in a first optical area and a normal area NA to be different from each other.

According to aspects of the present disclosure, a display device is provided that includes a display area, a light emitting element, and a first capping layer located on the light emitting element.

The display area may include a first optical area and a normal area located outside of the first optical area.

The first capping layer included in the display device allows one or more of the thicknesses and refractive indexes of respective portions of a first capping layer located in a first optical area and a normal area NA to be different from each other.

According to one or more embodiments of the present disclosure, a display device can be provided that is capable of enabling a first optical area to have an excellent transmittance even when an electrode of a light emitting element located in the first optical area does not have a small thickness, by including a first capping layer located over the light emitting element and allowing one or more of the thicknesses and refractive indexes of respective portions of a first capping layer located in a first optical area and a normal area NA to be different from each other.

According to one or more embodiments of the present disclosure, a display device can be provided that is capable of enabling a first optical area to have an excellent transmittance even when an electrode of a light emitting element located in the first optical area does not have a small thickness, and thereby, is capable of preventing the efficiency of the light emitting element from being decreased or the lifetime thereof from being reduced as the thickness of the electrode of the light emitting element is reduced.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings:

FIG. 4 illustrates example arrangements of subpixels in three areas included in a display area of the display device according to embodiments of the present disclosure;

FIG. 5A illustrates example arrangements of signal lines in each of a first optical area and a normal area in the display device according to embodiments of the present disclosure;

FIG. 5B illustrates example arrangements of signal lines in each of a second optical area and a normal area in the display device according to embodiments of the present disclosure;

FIG. 16 illustrates respective transmittances of a display device according to an embodiment of the present disclosure and a display device according to a comparative example.

DETAILED DESCRIPTION

Figure 1A:
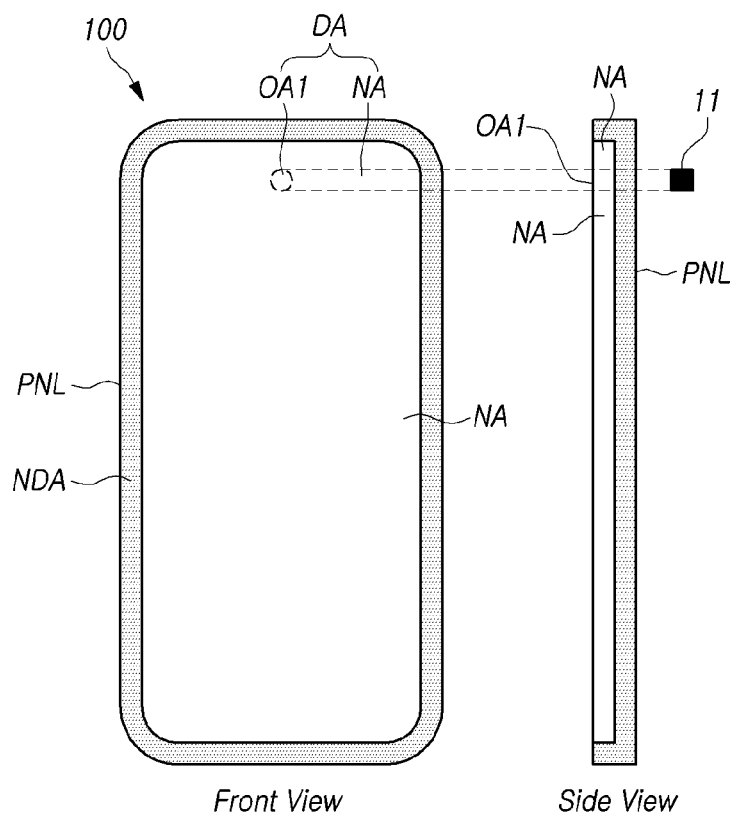
FIGS. 1A, 1B and 1C are plan views illustrating an example display device according to embodiments of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference. In describing a temporal relationship, when the temporal order is described as, for example, "after," "subsequent," "next," or "before," a case which is not continuous may be included unless a more limiting term, such as "just," "immediate(ly)," or "direct(ly)," is used. Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

Hereinafter, with reference to the accompanying drawings, various embodiments of the present disclosure will be described in detail.

Figure 1B:
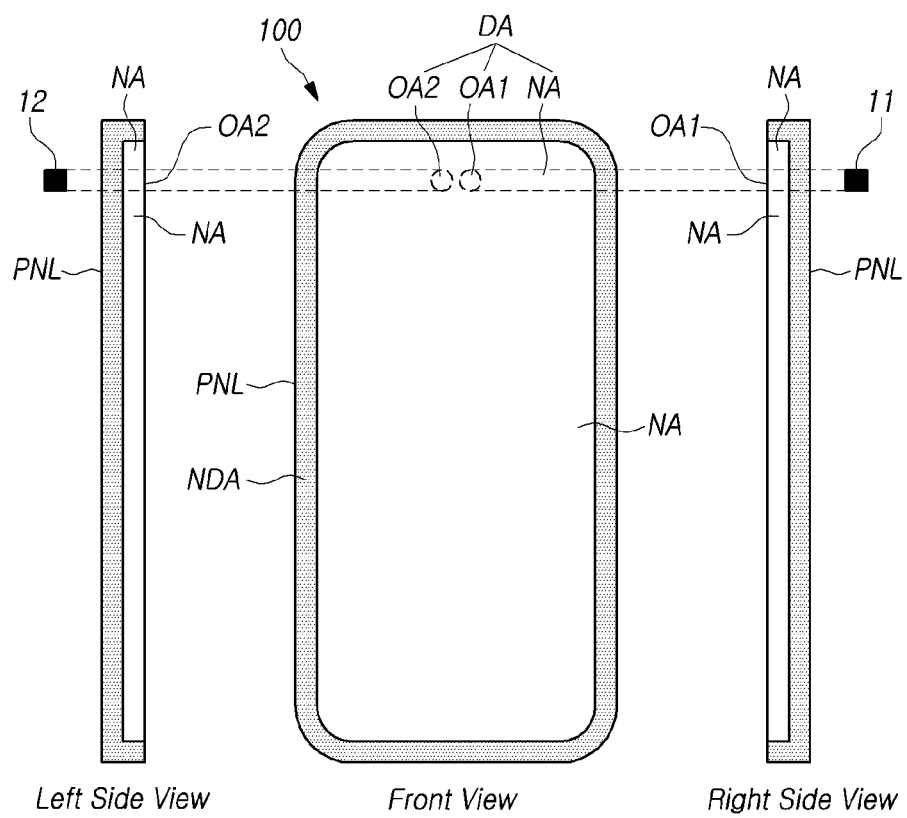
Figure 1C:
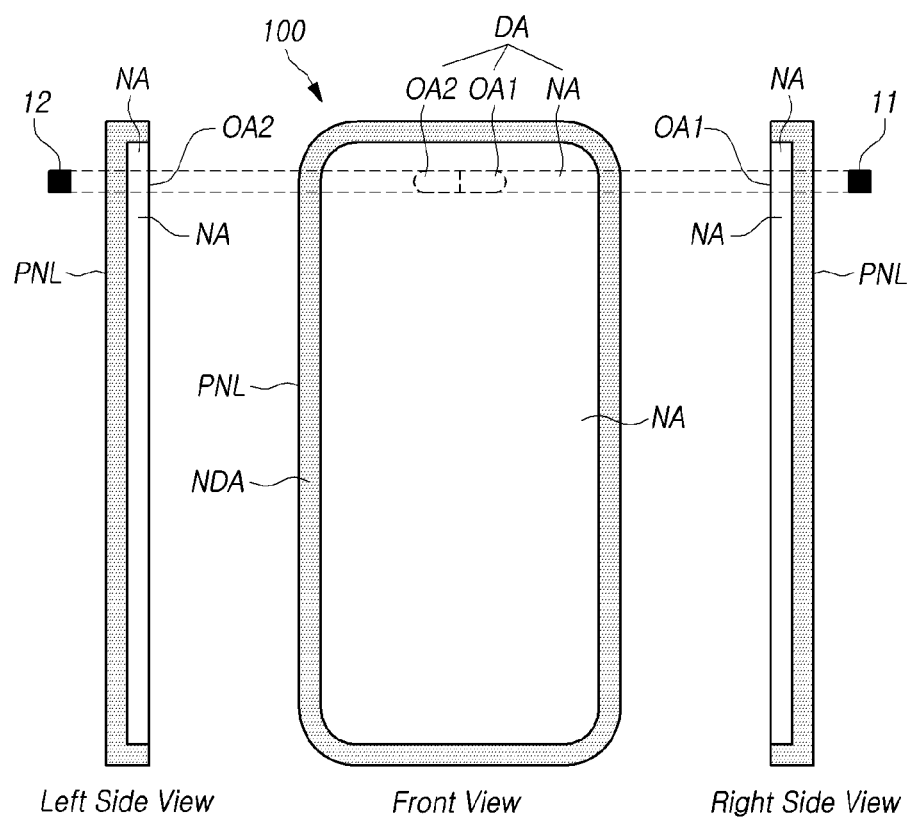

FIGS. 1A, 1B and 1C are plan views illustrating an example display device according to embodiments of the present disclosure.

Referring to FIGS. 1A, 1B, and 1C, a display device 100 according to embodiments of the present disclosure may include a display panel PNL for displaying an image, and one or more optical electronic devices (11 and/or 12). Herein, an optical electronic device may be referred to as a light detector, a light receiver, or a light sensing device. An optical electronic device may include one or more of a camera, a camera lens, a sensor, a sensor for detecting images, or the like.

The display panel PNL may include a display area DA in which an image is displayed and a non-display area NDA in which an image is not displayed.

A plurality of subpixels may be arranged in the display area DA, and several types of signal lines for driving the plurality of subpixels may be arranged therein.

The non-display area NDA may refer to an area outside of the display area DA. Several types of signal lines may be arranged in the non-display area NDA, and several types of driving circuits can be connected thereto. At least a portion of the non-display area NDA may be bent to be invisible from the front of the display panel or may be covered by a case (not shown) of the display panel PNL or the display device 100. The non-display area NDA may be also referred to as a bezel or a bezel area.

Referring to FIGS. 1A, 1B, and 1C, in the display device 100 according to aspects of the present disclosure, the one or more optical electronic devices (11 and/or 12) may be located under, or in a lower portion of, the display panel PNL (an opposite side to the viewing surface thereof).

Light can enter the front surface (viewing surface) of the display panel PNL, pass through the display panel PNL, reach one or more optical electronic devices (11 and/or 12) located under, or in the lower portion of, the display panel PNL (the opposite side of the viewing surface).

The one or more optical electronic devices (11 and/or 12) can receive or detect light transmitting through the display panel PNL and perform a predefined function based on the received light. For example, the one or more optical electronic devices (11 and/or 12) may include one or more of the following: an image capture device such as a camera (an image sensor), and/or the like; or a sensor such as a proximity sensor, an illuminance sensor, and/or the like.

Referring to FIGS. 1A, 1B, and 1C, in the display panel PNL according to aspects of the present disclosure, the display area DA may include one or more optical areas (OA1 and/or OA2) and a normal area NA. Herein, the term "normal area" NA is an area that while being present in the display area DA, does not overlap with one or more optical electronic devices (11 and/or 12) and may also be referred to as a non-optical area.

Referring to FIGS. 1A, 1B, and 1C, the one or more optical areas (OA1 and/or OA2) may be one or more areas overlapping the one or more optical electronic devices (11 and/or 12).

According to an example of FIG. 1A, the display area DA may include a first optical area OA1 and a normal area NA.

In this example, at least a portion of the first optical area OA1 may overlap a first optical electronic device 11.

According to an example of FIG. 1B, the display area DA may include a first optical area OA1, a second optical area OA2, and a normal area NA. In the example of FIG. 1B, at least a portion of the normal area NA may be present between the first optical area OA1 and the second optical area OA2. In this example, at least a portion of the first optical area OA1 may overlap the first optical electronic device 11, and at least a portion of the second optical area OA2 may overlap a second optical electronic device 12.

According to an example of FIG. 1C, the display area DA may include a first optical area OA1, a second optical area OA2, and a normal area NA. In the example of FIG. 1C, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In some embodiments, an image display structure and a light transmission structure are formed in the one or more optical areas (OA1 and/or OA2). For example, since the one or more optical areas (OA1 and/or OA2) are a portion of the display area DA, therefore, subpixels for displaying an image are needed to be disposed in the one or more optical areas (OA1 and/or OA2). Further, to enable light to transmit through the one or more optical electronic devices (11 and/or 12), a light transmission structure is needed, and thus is formed in the one or more optical areas (OA1 and/or OA2).

Even though the one or more optical electronic devices (11 and/or 12) are needed to receive or detect light, the one or more optical electronic devices (11 and/or 12) may be located on the back of the display panel PNL (e.g., on an opposite side of a viewing surface). In this embodiment, the one or more optical electronic devices (11 and/or 12) are located, for example, under, or in a lower portion of, the display panel PNL, and is configured to receive light that has transmitted through the display panel PNL.

For example, the one or more optical electronic devices (11 and/or 12) are not exposed in the front surface (viewing surface) of the display panel PNL. Accordingly, when a user faces the front surface of the display device 100, the one or more optical electronic devices (11 and/or 12) are located so that they are invisible to the user.

In one embodiment, the first optical electronic device 11 may be a camera, and the second optical electronic device 12 may be a sensor such as a proximity sensor, an illuminance sensor, an infrared sensor, and/or the like. For example, the camera may be a camera lens, an image sensor, or a unit including at least one of the camera lens and the image sensor. The sensor may be, for example, an infrared sensor capable of detecting infrared rays.

In another embodiment, the first optical electronic device 11 may be a sensor, and the second optical electronic device 12 may be a camera.

Hereinafter, simply for convenience, discussions that follow will refer to embodiments where the first optical electronic device 11 is a camera, and the second optical electronic device 12 is a sensor. It should be, however, understood that the scope of the present disclosure includes embodiments where the first optical electronic device 11 is the sensor, and the second optical electronic device 12 is the camera. For example, the camera may be a camera lens, an image sensor, or a unit including at least one of the camera lens and the image sensor.

In the example where the first optical electronic device 11 is a camera, this camera may be located on the back of (e.g., under, or in a lower portion of) the display panel PNL, and be a front camera capable of capturing objects or images in a front direction of the display panel PNL. Accordingly, the user can capture an image or object through the camera that is invisible on the viewing surface while looking at the viewing surface of the display panel PNL.

Although the normal area NA and the one or more optical areas (OA1 and/or OA2) included in the display area DA in each of FIGS. 1A, 1B, and 1C are areas where images can be displayed, the normal area NA is an area where a light transmission structure need not be formed, but the one or more optical areas (OA1 and/or OA2) are areas where the light transmission structure need be formed. Thus, in some embodiments, the normal area NA is an area where a light transmission structure is not implemented or included, and the one or more optical areas (OA1 and/or OA2) are areas in which the light transmission structure is implemented or included.

Accordingly, the one or more optical areas (OA1 and/or OA2) may have a transmittance greater than or equal to a predetermined level, (e.g., a relatively high transmittance) and the normal area NA may not have light transmittance or have a transmittance less than the predetermined level (e.g., a relatively low transmittance).

For example, the one or more optical areas (OA1 and/or OA2) may have a resolution, a subpixel arrangement structure, the number of subpixels per unit area, an electrode structure, a line structure, an electrode arrangement structure, a line arrangement structure, or/and the like different from that/those of the normal area NA.

In one embodiment, the number of subpixels per unit area in the one or more optical areas (OA1 and/or OA2) may be less than the number of subpixels per unit area in the normal area NA. For example, the resolution of the one or more optical areas (OA1 and/or OA2) may be less than that of the normal area NA. Here, the number of subpixels per unit area may be a unit for measuring resolution, for example, referred to as pixels (or subpixels) per inch (PPI), which represents the number of pixels within 1 inch.

In one embodiment, in each of FIGS. 1A, 1B, and 1C, the number of subpixels per unit area in the first optical areas OA1 may be less than the number of subpixels per unit area in the normal area NA. In one embodiment, in each of FIGS. 1B and 1C, the number of subpixels per unit area in the second optical areas OA2 may be greater than or equal to the number of subpixels per unit area in the first optical areas OA1.

In each of FIGS. 1A, 1B, and 1C, the first optical area OA1 may have various shapes, such as a circle, an ellipse, a quadrangle, a hexagon, an octagon or the like. In each of FIGS. 1B, and 1C, the second optical area OA2 may have various shapes, such as a circle, an ellipse, a quadrangle, a hexagon, an octagon or the like. The first optical area OA1 and the second optical area OA2 may have the same shape or different shapes.

Referring to FIG. 1C, in the example where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like.

Hereinafter, for convenience of description, discussions will be provided based on embodiments in which each of the first optical area OA1 and the second optical area OA2 has a circular shape. It should be, however, understood that the scope of the present disclosure includes embodiments where one or both of the first optical area OA1 and the second optical area OA2 have a shape other than a circular shape.

In examples where the display device 100 according to aspects of the present disclosure has a structure in which the first optical electronic device 11 such as a camera, and the like is located under, or in a lower portion of, the display panel PNL without being exposed to the outside, such a display device 100 according to aspects of the present disclosure may be referred to as a display in which under-display camera (UDC) technology is implemented.

According to these examples, the display device 100 according to aspects of the present disclosure can have an advantage of preventing the size of the display area DA from being reduced because a notch or a camera hole for exposing a camera need not be formed in the display panel PNL.

Since the notch or the camera hole for camera exposure need not be formed in the display panel PNL, the display device 100 can have further advantages of reducing the size of the bezel area, and improving the degree of freedom in design as such limitations to the design are removed.

Although the one or more optical electronic devices (11 and/or 12) are located to be covered on the back of (under, or in the lower portion of) the display panel PNL in the display device 100 according to aspects of the present disclosure, that is, hidden not to be exposed to the outside, the one or more optical electronic devices (11 and/or 12) are needed to be able to receive or detect light for normally performing predefined functionality.

Further, in the display device 100 according to aspects of the present disclosure, although the one or more optical electronic devices (11 and/or 12) are located to be covered on the back of (under, or in the lower portion of) the display panel PNL and located to overlap the display area DA, it is necessary for image display to be normally performed in the one or more optical areas (OA1 and/or OA2) overlapping the one or more optical electronic devices (11 and/or 12) in the area DA.

Figure 2:
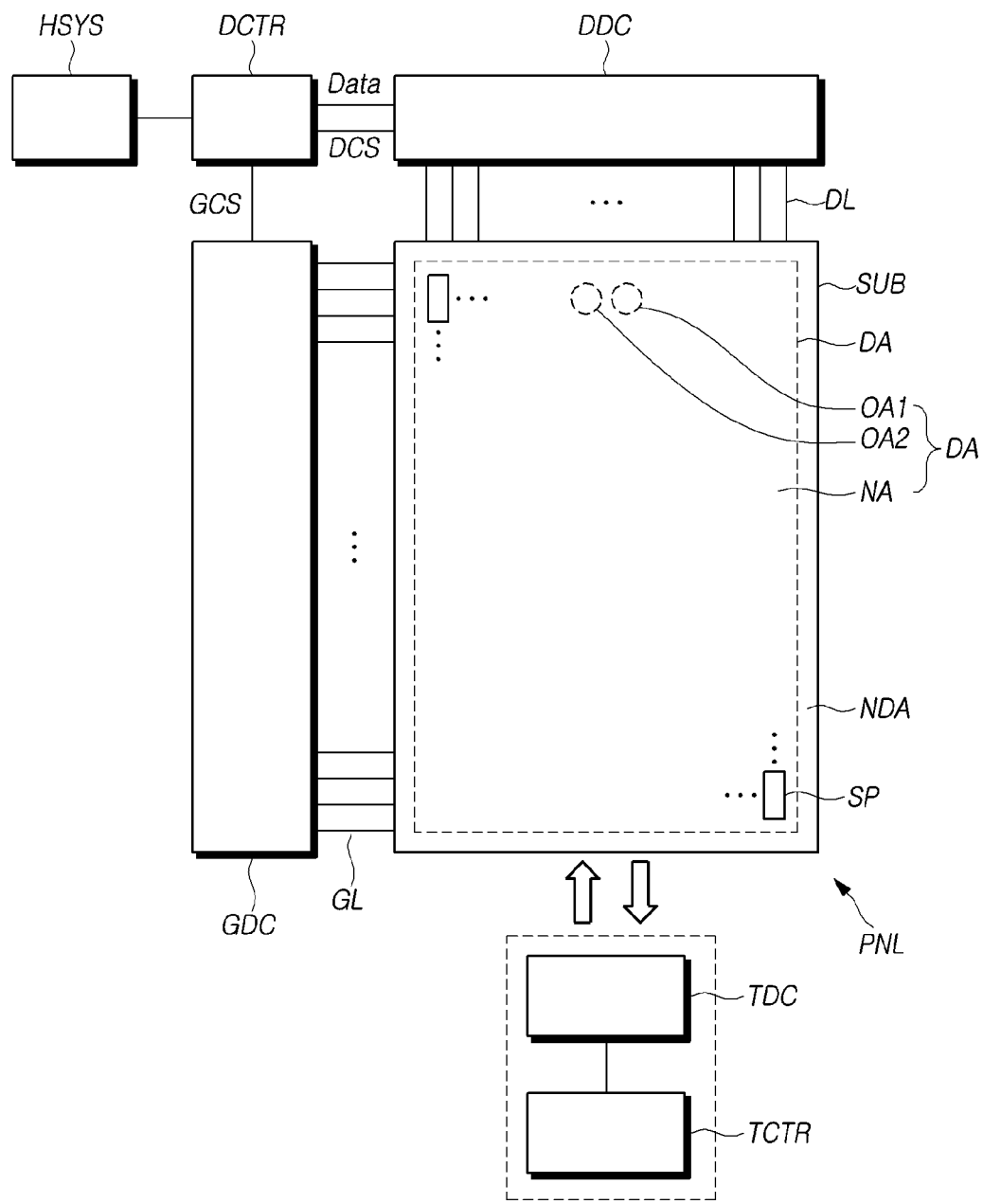
FIG. 2 illustrates an example system configuration of the display device according to embodiments of the present disclosure.

FIG. 2 illustrates an example system configuration of the display device 100 according to embodiments of the present disclosure.

Referring to FIG. 2, the display device 100 may include the display panel PNL and a display driving circuit as components for displaying an image.

The display driving circuit is a circuit for driving the display panel PNL, and may include a data driving circuit DDC, a gate driving circuit GDC, a display controller DCTR, and other components.

The display panel PNL may include a display area DA in which an image is displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel PNL may include a substrate SUB and a plurality of subpixels SP disposed on the substrate SUB. The display panel PNL may further include various types of signal lines to drive the plurality of subpixels SP.

In some embodiments, the display device 100 herein may be a liquid crystal display device, or the like, or a self-emission display device in which light is emitted from the display panel PNL itself. In some embodiments, when the display device 100 is the self-emission display device, each of the plurality of subpixels SP may include a light emitting element.

In one embodiment, the display device 100 according to aspects of the present disclosure may be an organic light emitting display device in which the light emitting element is implemented using an organic light emitting diode (OLED). In another embodiment, the display device 100 according to aspects of the present disclosure may be an inorganic light emitting display device in which the light emitting element is implemented using an inorganic material-based light emitting diode. In further another embodiment, the display device 100 according to aspects of the present disclosure may be a quantum dot display device in which the light emitting element is implemented using quantum dots, which are self-emission semiconductor crystals.

The structure of each of the plurality of subpixels SP may vary according to types of the display devices 100. For example, when the display device 100 is a self-emission display device including self-emission subpixels SP, each subpixel SP may include a self-emission light emitting element, one or more transistors, and one or more capacitors.

The various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like.

The plurality of data lines DL and the plurality of gate lines GL may intersect each other. Each of the plurality of data lines DL may extend in a first direction. Each of the plurality of gate lines GL may extend in a second direction.

For example, the first direction may be a column or vertical direction, and the second direction may be a row or horizontal direction. In another example, the first direction may be the row direction, and the second direction may be the column direction.

The data driving circuit DDC is a circuit for driving the plurality of data lines DL, and can supply data signals to the plurality of data lines DL. The gate driving circuit GDC is a circuit for driving the plurality of gate lines GL, and can supply gate signals to the plurality of gate lines GL.

The display controller DCTR may be a device for controlling the data driving circuit DDC and the gate driving circuit GDC, and can control driving timing for the plurality of data lines DL and driving timing for the plurality of gate lines GL.

The display controller DCTR can supply a data driving control signal DCS to the data driving circuit DDC to control the data driving circuit DDC, and supply a gate driving control signal GCS to the gate driving circuit GDC to control the gate driving circuit GDC.

The display controller DCTR can receive input image data from a host system HSYS and supply image data Data to the data driving circuit DDC based on the input image data.

The data driving circuit DDC can supply data signals to the plurality of data lines DL according to driving timing control of the display controller DCTR.

The data driving circuit DDC can receive the digital image data Data from the display controller DCTR, convert the received image data Data into analog data signals, and supply the resulting analog data signals to the plurality of data lines DL.

The gate driving circuit GDC can supply gate signals to the plurality of gate lines GL according to timing control of the display controller DCTR. The gate driving circuit GDC can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit DDC may be connected to the display panel PNL in a tape automated bonding (TAB) type, or connected to a conductive pad such as a bonding pad of the display panel PNL in a chip on glass (COG) type or a chip on panel (COP) type, or connected to the display panel PNL in a chip on film (COF) type.

In some embodiments, the gate driving circuit GDC may be connected to the display panel PNL in the tape automated bonding (TAB) type, or connected to a conductive pad such as a bonding pad of the display panel PNL in the chip on glass (COG) type or the chip on panel (COP) type, or connected to the display panel PNL in the chip on film (COF) type. In another embodiment, the gate driving circuit GDC may be disposed in the non-display area NDA of the display panel PNL in a gate in panel (GIP) type. The gate driving circuit GDC may be disposed on or over the substrate, or connected to the substrate. That is, in the case of the GIP type, the gate driving circuit GDC may be disposed in the non-display area NDA of the substrate. The gate driving circuit GDC may be connected to the substrate in the case of the chip on glass (COG) type, the chip on film (COF) type, or the like.

In some embodiments, at least one of the data driving circuit DDC and the gate driving circuit GDC may be disposed in the display area DA of the display panel PNL. For example, at least one of the data driving circuit DDC and the gate driving circuit GDC may be disposed not to overlap subpixels SP, or disposed to be overlapped with one or more, or all, of the subpixels SP.

The data driving circuit DDC may also be located on, but not limited to, only one side or portion (e.g., an upper edge or a lower edge) of the display panel PNL. In some embodiments, the data driving circuit DDC may be located in, but not limited to, two sides or portions (e.g., an upper edge and a lower edge) of the display panel PNL or at least two of four sides or portions (e.g., the upper edge, the lower edge, a left edge, and a right edge) of the display panel PNL according to driving schemes, panel design schemes, or the like.

The gate driving circuit GDC may be located in only one side or portion (e.g., a left edge or a right edge) of the display panel PNL. In some embodiments, the gate driving circuit GDC may be connected to two sides or portions (e.g., a left edge and a right edge) of the panel PNL, or be connected to at least two of four sides or portions (e.g., an upper edge, a lower edge, the left edge, and the right edge) of the panel PNL according to driving schemes, panel design schemes, or the like.

The display controller DCTR may be implemented in a separate component from the data driving circuit DDC, or integrated with the data driving circuit DDC and thus implemented in an integrated circuit.

The display controller DCTR may be a timing controller used in the typical display technology or a controller or a control device capable of performing other control functions in addition to the function of the typical timing controller. In some embodiments, the display controller DCTR may be a controller or a control device different from the timing controller, or a circuitry or a component included in the controller or the control device. The display controller DCTR may be implemented with various circuits or electronic components such as an integrated circuit (IC), a field programmable gate array (FPGA), an application specific integrated circuit (ASIC), a processor, and/or the like.

The display controller DCTR may be mounted on a printed circuit board, a flexible printed circuit, and/or the like and be electrically connected to the gate driving circuit DDC and the data driving circuit GDC through the printed circuit board, flexible printed circuit, and/or the like.

The display controller DCTR may transmit signals to, and receive signals from, the data driving circuit DDC via one or more predefined interfaces. In some embodiments, such interfaces may include a low voltage differential signaling (LVDS) interface, an embedded clock point-point interface (EPI), a serial peripheral interface (SPI), and the like.

In some embodiments, in order to further provide a touch sensing function, as well as an image display function, the display device 100 may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit may include a touch driving circuit TDC capable of generating and providing touch sensing data by driving and sensing the touch sensor, a touch controller TCTR capable of detecting the occurrence of a touch event or detecting a touch position using the touch sensing data, and one or more other components.

The touch sensor can include a plurality of touch electrodes. The touch sensor can further include a plurality of touch lines for electrically connecting the plurality of touch electrodes to the touch driving circuit TDC.

The touch sensor may be implemented in a touch panel, or in the form of a touch panel, outside of the display panel PNL, or be implemented inside of the display panel PNL. In the example where the touch sensor is implemented in the touch panel, or in the form of the touch panel, outside of the display panel PNL, such a touch sensor is referred to as an add-on type. In the example where the add-on type of touch sensor is disposed, the touch panel and the display panel PNL may be separately manufactured and coupled during an assembly process. The add-on type of touch panel may include a touch panel substrate and a plurality of touch electrodes on the touch panel substrate.

In the example where the touch sensor is implemented inside of the display panel PNL, a process of manufacturing the display panel PNL may include disposing the touch sensor over the substrate SUB together with signal lines and electrodes related to driving the display device 100.

The touch driving circuit TDC can supply a touch driving signal to at least one of the plurality of touch electrodes, and sense at least one of the plurality of touch electrodes to generate touch sensing data.

The touch sensing circuit can perform touch sensing using a self-capacitance sensing technique or a mutual-capacitance sensing technique.

In the example where the touch sensing circuit performs touch sensing in the self-capacitance sensing technique, the touch sensing circuit can perform touch sensing based on capacitance between each touch electrode and a touch object (e.g., a finger, a pen, and the like).

According to the self-capacitance sensing method, each of the plurality of touch electrodes can serve as both a driving touch electrode and a sensing touch electrode. The touch driving circuit TDC can drive all, or one or more, of the plurality of touch electrodes and sense all, or one or more, of the plurality of touch electrodes.

In the example where the touch sensing circuit performs touch sensing in the mutual-capacitance sensing technique, the touch sensing circuit can perform touch sensing based on capacitance between touch electrodes.

According to the mutual-capacitance sensing method, the plurality of touch electrodes are divided into driving touch electrodes and sensing touch electrodes. The touch driving circuit TDC can drive the driving touch electrodes and sense the sensing touch electrodes.

The touch driving circuit TDC and the touch controller TCTR included in the touch sensing circuit may be implemented in separate devices or in a single device. Further, the touch driving circuit TDC and the data driving circuit DDC may be implemented in separate devices or in a single device.

The display device 100 may further include a power supply circuit for supplying various types of power to the display driving circuit and/or the touch sensing circuit.

In some embodiments, the display device 100 may be a mobile terminal such as a smart phone, a tablet, or the like, or a monitor, a television (TV), or the like. Such devices may be of various types, sizes, and shapes. The display device 100 according to embodiments of the present disclosure are not limited thereto, and includes displays of various types, sizes, and shapes for displaying information or images.

As described above, the display area DA of the display panel PNL may include a normal area (e.g., the normal area NA of FIGS. 1A, 1B and 1C) and one or more optical areas (e.g., the first and/or second optical areas OA1 and/or OA2 of FIGS. 1A, 1B and 1C).

The normal area NA and the one or more optical areas (OA1 and/or OA2) are areas where an image can be displayed. However, the normal NA is an area in which a light transmission structure need not be implemented, and the one or more optical areas (OA1 and/or OA2) are areas in which the light transmission structure need be implemented.

As discussed above with respect to the examples of FIGS. 1A, 1B, and 1C, although the display area DA of the display panel PNL may include the one or more optical areas (OA1 and/or OA2) in addition to the normal area NA, for convenience of description, in discussions that follow, it is assumed that the display area DA includes first and second optical areas (OA1 and OA2) and the normal area NA; and the normal area NA thereof includes the normal areas NAs in FIGS. 1A to 1C, and the first and second optical areas (OA1, OA2) thereof include the first optical areas OA1 s in FIGS. 1A, 1B, and 1C and the second optical areas OA2s of FIGS. 1B and 1C, respectively, unless explicitly stated otherwise.

Figure 3:
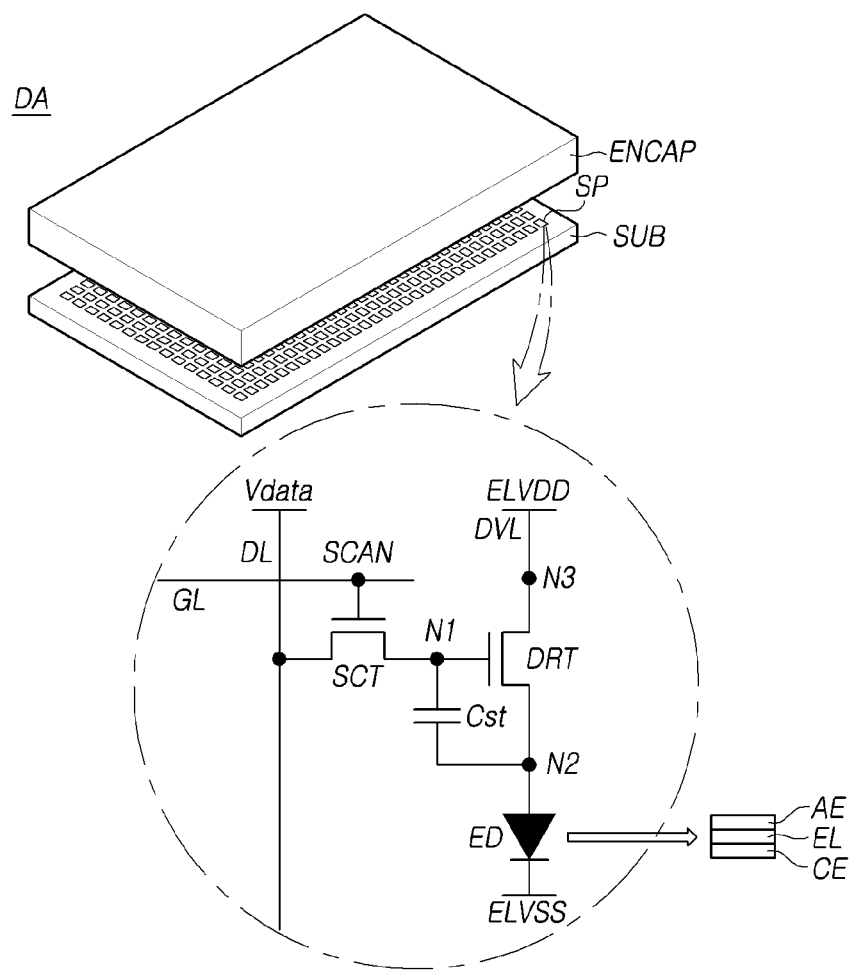
FIG. 3 illustrates an example equivalent circuit of a subpixel in the display device according to embodiments of the present disclosure.

FIG. 3 illustrates an example equivalent circuit of a subpixel SP in the display panel PNL according to aspects of the present disclosure.

Each of subpixels SP disposed in the normal area NA, the first optical area OA1, and the second optical area OA2 included in the display area DA of the display panel PNL may include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT may include the first node N1 to which a data voltage is applied, a second node N2 electrically connected to the light emitting element ED, and a third node N3 to which a driving voltage ELVDD is applied through a driving voltage line DVL. In the driving transistor DRT, the first node N1 may be a gate node, the second node N2 may be a source node or a drain node, and the third node N3 may be the drain node or the source node.

The light emitting element ED can include an anode electrode AE, an emission layer EL, and a cathode electrode CE. The anode electrode AE may be a pixel electrode disposed in each subpixel SP, and may be electrically connected to the second node N2 of the driving transistor DRT of each subpixel SP. The cathode electrode CE may be a common electrode commonly disposed in the plurality of subpixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in discussions that follow, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. In the example where an organic light emitting diode is used as the light emitting element ED, the emission layer EL included in the light emitting element ED may include an organic emission layer including an organic material.

The scan transistor SCT may be turned on and off by a scan signal SCAN that is a gate signal applied through a gate line GL, and be electrically connected between the first node N1 of the driving transistor DRT and a data line DL.

The storage capacitor Cst may be electrically connected between the first node N1 and the second node N2 of the driving transistor DRT.

Each subpixel SP may include two transistors (2T: DRT and SCT) and one capacitor (1C: Cst) (which may be referred to as a "2T1C structure") as illustrated in FIG. 3, and in some cases, may further include one or more transistors, or further include one or more capacitors.

In some embodiments, the storage capacitor Cst, which may be present between the first node N1 and the second node N2 of the driving transistor DRT, may be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT and the scan transistor SCT may be an n-type transistor or a p-type transistor.

Since circuit elements (e.g., in particular, a light emitting element ED) in each subpixel SP are vulnerable to external moisture or oxygen, an encapsulation layer ENCAP may be disposed in the display panel PNL in order to prevent the external moisture or oxygen from penetrating into the circuit elements (e.g., in particular, the light emitting element ED). The encapsulation layer ENCAP may be disposed to cover the light emitting element ED.

In some embodiments, as a method for increasing a transmittance of at least one of the first optical area OA1 and the second optical area OA2, a technique (which may be referred to as a "pixel density differentiation design scheme") may be applied so that a density of pixels (or subpixels) or a degree of integration of pixels (or subpixels) can be differentiated as described above. According to the pixel density differentiation design scheme, in one embodiment, the display panel PNL may be designed such that the number of subpixels per unit area of at least one of the first optical area OA1 and the second optical area OA2 is less than the number of subpixels per unit area of the normal area NA.

In another embodiment, as another method for increasing a transmittance of at least one of the first optical area OA1 and the second optical area OA2, another technique (which may be referred to as a "pixel size differentiation design scheme") may be applied so that a size of a pixel (or a subpixel) can be differentiated. According to the pixel size differentiation design scheme, the display panel PNL may be designed such that the number of subpixels per unit area of at least one of the first optical area OA1 and the second optical area OA2 is equal to or similar to the number of subpixels per unit area of the normal area NA. However, a size of each subpixel SP (i.e., a size of a corresponding light emitting area) disposed in at least one of the first optical area OA1 and the second optical area OA2 is smaller than a size of each subpixel SP (i.e., a size of a corresponding light emitting area) disposed in the normal area NA.

For convenience of description, discussions that follow are provided based on the pixel density differentiation design scheme of the two schemes (i.e., the pixel density differentiation design scheme and the pixel size differentiation design scheme) for increasing the transmittance of at least one of the first optical area OA1 and the second optical area OA2, unless explicitly stated otherwise.

FIG. 4 illustrates example arrangements of subpixels SP in the three areas (NA, OA1, and OA2) included in the display area DA of the display panel PNL according to aspects of the present disclosure.

Referring to FIG. 4, in some embodiments, a plurality of subpixels SP may be disposed in each of the normal area NA, the first optical area OA1, and the second optical area OA2 included in the display area DA.

The plurality of subpixels SP may include, for example, a red subpixel (Red SP) emitting red light, a green subpixel (Green SP) emitting green light, and a blue subpixel (Blue SP) emitting blue light.

Accordingly, each of the normal area NA, the first optical area OA1, and the second optical area OA2 may include one or more light emitting areas EA of one or more red subpixels (Red SP), and one or more light emitting areas EA of one or more green subpixels (Green SP), and one or more light emitting areas EA of one or more blue subpixels (Blue SP).

Referring to FIG. 4, in some embodiments, the normal area NA may not include a light transmission structure, but may include light emitting areas EA.

In contrast, in some embodiments, the first optical area OA1 and the second optical area OA2 need to include both the light emitting areas EA and the light transmission structure.

Accordingly, the first optical area OA1 may include one or more light emitting areas EA and one or more first transmission areas TA1, and the second optical area OA2 may include one or more light emitting areas EA and one or more second transmission areas TA2.

The light emitting areas EA and the transmission areas (TA1 and/or TA2) may be distinct according to whether the transmission of light is allowed. For example, the light emitting areas EA may be areas not allowing light to transmit (e.g., not allowing light to transmit to the back of the display panel), and the transmission areas (TA1 and/or TA2) may be areas allowing light to transmit (e.g., allowing light to transmit to the back of the display panel).

The light emitting areas EA and the transmission areas (TA1 and/or TA2) may be also distinct according to whether or not a specific metal layer is included. For example, the cathode electrode CE as illustrated in FIG. 3 may be disposed in the light emitting areas EA, and the cathode electrode CE may not be disposed in the transmission areas (TA1 and/or TA2). In some embodiments, a light shield layer may be disposed in the light emitting areas EA, and a light shield layer may not be disposed in the transmission areas (TA1 and/or TA2).

Since the first optical area OA1 includes the first transmission areas TA1 and the second optical area OA2 includes the second transmission areas TA2, both of the first optical area OA1 and the second optical area OA2 are areas through which light can transmit.

In one embodiment, a transmittance (a degree of transmission) of the first optical area OA1 and a transmittance (a degree of transmission) of the second optical area OA2 may be substantially equal.

For example, the first transmission area TA1 of the first optical area OA1 and the second transmission area TA2 of the second optical area OA2 may have substantially the same shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 may be substantially equal. In an example, each of the first transmission areas TA1s has the same shape and size. In an example, each of the second transmission areas TA2s has the same shape and size.

In another embodiment, a transmittance (a degree of transmission) of the first optical area OA1 and a transmittance (a degree of transmission) of the second optical area OA2 may be different.

For example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have substantially the same shape or size, a ratio of the first transmission area TA1 to the first optical area OA1 and a ratio of the second transmission area TA2 to the second optical area OA2 may be different from each other.

For example, in the example where the first optical electronic device 11, as illustrated in FIGS. 1A, 1B and 1C, overlapping the first optical area OA1 is a camera, and the second optical electronic device 12, as illustrated in FIGS. 1B and 1C, overlapping the second optical area OA2 is a sensor for detecting images, the camera may need a greater amount of light than the sensor.

Thus, the transmittance (degree of transmission) of the first optical area OA1 may be greater than the transmittance (degree of transmission) of the second optical area OA2.

For example, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have substantially the same size, a ratio of the first transmission area TA1 to the first optical area OA1 may be greater than a ratio of the second transmission area TA2 to the second optical area OA2.

For convenience of description, discussions that follows are provided based on the embodiment in which the transmittance (degree of transmission) of the first optical area OA1 is greater than the transmittance (degree of transmission) of the second optical area OA2.

Further, the transmission areas (TA1, TA2) as shown in FIG. 4 may be referred to as transparent areas, and the term transmittance may be referred to as transparency.

Further, in discussions that follow, it is assumed that the first optical areas OA1 and the second optical areas OA2 are located in an upper edge of the display area DA of the display panel PNL, and are disposed to be horizontally adjacent to each other such as being disposed in a direction in which the upper edge extends, as shown in FIG. 4, unless explicitly stated otherwise.

Referring to FIG. 4, a horizontal display area in which the first optical area OA1 and the second optical area OA2 are disposed is referred to as a first horizontal area HA1 and another horizontal display area in which the first optical area OA1 and the second optical area OA2 are not disposed is referred to as a second horizontal area HA2.

Referring to FIG. 4, the first horizontal area HA1 may include a portion of the normal area NA, the first optical area OA1, and the second optical area OA2. The second horizontal area HA2 may include only another portion of the normal area NA.

FIG. 5A illustrates example arrangements of signal lines in each of a first optical area (e.g., the first optical area OA1 in the figures discussed above) and a normal area (e.g., the normal area NA in the figures discussed above) of the display panel PNL according to embodiments of the present disclosure. FIG. 5B illustrates example arrangements of signal lines in each of a second optical area (e.g., the second optical area OA2 in the figures discussed above) and the normal area NA of the display panel PNL according to embodiments of the present disclosure.

A first horizontal area HA1 shown in FIGS. 5A and 5B is a portion of a first horizontal display area (e.g., the first horizontal area HA1 of FIG. 4) of the display panel PNL, and a second horizontal area HA2 is a portion of a second horizontal display area (e.g., the second horizontal area HA2 of FIG. 4) of the display panel PNL.

The first optical area OA1 shown in FIG. 5A is a portion of a first optical area (e.g., the first optical area OA1 in the figures discussed above) of the display panel PNL, and the second optical area OA2 shown in FIG. 5B is a portion of a second optical area (e.g., the second optical area OA2 in the figures discussed above) of the display panel PNL.

Referring to FIGS. 5A and 5B, the first horizontal area HA1 may include a portion of the normal area NA, the first optical area OA1, and the second optical area OA2. The second horizontal area HA2 may include another portion of the normal area NA.

Various types of horizontal lines (HL1 and HL2) and various types of vertical lines (VLn, VL1, and VL2) may be disposed in the display panel PNL.

In some embodiments, the term "horizontal" and the term "vertical" are used to refer to two directions intersecting the display panel. However, it should be noted that the horizontal direction and the vertical direction may be changed depending on a viewing direction. The horizontal direction may refer to, for example, a direction in which one gate line GL extends and, and the vertical direction may refer to, for example, a direction in which one data line DL extends. As such, the term horizontal and the term vertical are used to represent two directions.

Referring to FIGS. 5A and 5B, the horizontal lines disposed in the display panel PNL may include first horizontal lines HL1 disposed in the first horizontal area HA1 and second horizontal lines HL2 disposed in the second horizontal area HA2.

The horizontal lines disposed in the display panel PNL may be gate lines GL (which may be referred to as scan lines). That is, the first horizontal lines HL1 and the second horizontal lines HL2 may be the gate lines GL. The gate lines GL may include various types of gate lines according to structures of one or more subpixels SP.

Referring to FIGS. 5A and 5B, the vertical lines disposed in the display panel PNL may include normal vertical lines VLn disposed only in the normal area NA, first vertical lines VL1 running through both of the first optical area OA1 and the normal area NA, and second vertical lines VL2 running through both of the second optical area OA2 and the normal area NA.

The vertical lines disposed in the display panel PNL may include data lines DL, driving voltage lines DVL, and the like, and may further include reference voltage lines, initialization voltage lines, and the like. That is, the normal vertical lines VLn, the first vertical lines VL1 and the second vertical lines VL2 may include data lines DL, driving voltage lines DVL, and the like, and further include reference voltage lines, initialization voltage lines, and the like.

In some embodiments, it should be noted that the term "horizontal" in the second horizontal line HL2 may mean that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, one or more of the second horizontal lines HL2 may include one or more bent or folded portions that are different from the configurations shown in FIGS. 5A and 5B. Likewise, one or more of the first horizontal lines HL1 may also include one or more bent or folded portions.

In some embodiments, it should be noted that the term "vertical" in the normal vertical line VLn may mean that a signal is carried from an upper portion, to a lower portion, of the display panel (or from the lower portion to the upper portion), and may not mean that the normal vertical line VLn runs in a straight line only in the direct vertical direction. For example, in FIGS. 5A and 5B, although the normal vertical lines VLn are illustrated in a straight line, one or more of the normal vertical lines VLn may include one or more bent or folded portions that are different from the configurations shown in FIGS. 5A and 5B. Likewise, one or more of the first vertical line VL1 and one or more of the second vertical line VL2 may also include one or more bent or folded portions.

Referring to FIG. 5A, the first optical area OA1 included in the first horizontal area HA1 may include light emitting areas EA, as shown in FIG. 4, and first transmission areas TA1. In the first optical area OA1, respective outer areas of the first transmission areas TA1 may include light emitting areas EA.

Referring to FIG. 5A, in order to improve the transmittance of the first optical area OA1, the first horizontal lines HL1 may run (e.g., extend) through the first optical area OA1 while avoiding the first transmission areas TA1 in the first optical area OA1.

Accordingly, each of the first horizontal lines HL1 running (e.g., extending) through the first optical area OA1 may include one or more curved or bent portions running around one or more respective outer edges of one or more of the first transmission areas TA1.

Accordingly, the first horizontal lines HL1 disposed in the first horizontal area HA1 and the second horizontal lines HL2 disposed in the second horizontal area HA2 may have different shapes or lengths. For example, the first horizontal lines HL1 running through the first optical area OA1 and the second horizontal lines HL2 not running through the first optical area OA1 may have different shapes or lengths.

Further, in order to improve the transmittance of the first optical area OA1, the first vertical lines VL1 may run (e.g., extend) through the first optical area OA1 while avoiding the first transmission areas TA1 in the first optical area OA1.

Accordingly, each of the first vertical lines VL1 running (e.g., extending) through the first optical area OA1 may include one or more curved or bent portions running around one or more respective outer edges of one or more of the first transmission areas TA1.

Thus, the first vertical lines VL1 running through the first optical area OA1 and the normal vertical lines VLn disposed in the normal area NA without running through the first optical area OA1 may have different shapes or lengths.

Referring to FIG. 5A, the first transmission areas TA1 included in the first optical area OA1 in the first horizontal area HA1 may be arranged in a diagonal direction.

Referring to FIG. 5A, in the first optical area OA1 in the first horizontal area HAL one or more light emitting areas EA may be disposed between two horizontally adjacent first transmission areas TA1. In the first optical area OA1 in the first horizontal area HAL one or more light emitting areas EA may be disposed between two first transmission areas TA1 adjacent to each other in up and down directions (e.g., two vertically-adjacent first transmission areas TA1).

Referring to FIG. 5A, each of the first horizontal lines HL1 disposed in the first horizontal area HA1 (e.g., each of the first horizontal lines HL1 running through the first optical area OA1) may include one or more curved or bent portions running around one or more respective outer edges of one or more of the first transmission areas TA1.

Referring to FIG. 5B, the second optical area OA2 included in the first horizontal area HA1 may include light emitting areas EA and second transmission areas TA2. In the second optical area OA2, respective outer areas of the second transmission areas TA2 may include light emitting areas EA.

In one embodiment, the light emitting areas EA and the second transmission areas TA2 in the second optical area OA2 may have substantially the same locations and arrangements as the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A.

For example, referring to FIG. 5B, the second transmission areas TA2 in the second optical area OA2 may be arranged in the horizontal direction (the left to right or right to left direction). In this example, a light emitting area EA may not be disposed between two second transmission areas TA2 adjacent to each other in left and right directions (e.g., the horizontal direction). Further, one or more of the light emitting areas EA in the second optical area OA2 may be disposed between second transmission areas TA2 adjacent to each other in up and down directions (e.g., the vertical direction). For example, one or more light emitting areas EA may be disposed between two rows of second transmission areas.

When in the first horizontal area HAL the first horizontal lines HL1 run through the second optical area OA2 and the normal area NA adjacent to the second optical area OA2, in one embodiment, the first horizontal lines HL1 may have substantially the same arrangement as the first horizontal lines HL1 of FIG. 5A.

In another embodiment, as shown in FIG. 5B, when in the first horizontal area HAL running through the second optical area OA2 and the normal area NA adjacent to the second optical area OA2, the first horizontal lines HL1 may have an arrangement different from the first horizontal lines HL1 of FIG. 5A.

This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal area HAL the first horizontal lines HL1 run through the second optical area OA2 and the normal area NA adjacent to the second optical area OA2, the first horizontal lines HL1 may run between vertically adjacent second transmission areas TA2 in a straight line without having a curved or bent portion.

For example, one first horizontal line HL1 may have one or more curved or bent portions in the first optical area OA1, but may not have a curved or bent portion in the second optical area OA2.

In order to improve the transmittance of the second optical area OA2, the second vertical lines VL2 may run through the second optical area OA2 while avoiding the second transmission areas TA2 in the second optical area OA2.

Accordingly, each of the second vertical lines VL2 running through the second optical area OA2 may include one or more curved or bent portions running around one or more respective outer edges of one or more of the second transmission areas TA2.

Thus, the second vertical lines VL2 running through the second optical area OA2 and the normal vertical lines VLn disposed in the normal area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TA1.

Accordingly, a length of the first horizontal line HL1 running through the first optical area OA1 and the second optical area OA2 may be slightly longer than a length of the second horizontal line HL2 disposed only in the normal area NA without running through the first optical area OA1 and the second optical area OA2.

Accordingly, a resistance of the first horizontal line HL1 running through the first optical area OA1 and the second optical area OA2, which is referred to as a first resistance, may be slightly greater than a resistance of the second horizontal line HL2 disposed only in the normal area NA without running through the first optical area OA1 and the second optical area OA2, which is referred to as a second resistance.

Referring to FIGS. 5A and 5B, according to a light transmitting structure, since the first optical area OA1 that at least partially overlaps the first optical electronic device 11 includes the first transmitting areas TA1, and the second optical area OA2 that at least partially overlaps with the second optical electronic device 12 includes the second transmission areas TA2, therefore, the first optical area OA1 and the second optical area OA2 may have the number of subpixels per unit area smaller than the normal area NA.

Accordingly, the number of subpixels connected to each, or one or more, of the first horizontal lines HL1 running through the first optical area OA1 and the second optical area OA2 may be different from the number of subpixels connected to each, or one or more, of the second horizontal lines HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, may be less than the number of subpixels connected to each, or one or more, of the second horizontal lines HL2 disposed only in the normal area NA without running through the first optical area OA1 and the second optical area OA2, which is referred to as a second number.

A difference between the first number and the second number may vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number may increase.

As described above, since the number (the first number) of subpixels connected to each, or one or more, of the first horizontal lines HL1 running through the first optical area OA1 and the second optical area OA2 is less than the number of subpixels (second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 may be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be greatly less than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly less than an RC value of the second horizontal lines HL2 disposed only in the normal area NA without running through the first optical area OA1 and the second optical area OA2, which is referred to as a second RC value. Thus, in this example, the first RC value is greatly less than the second RC value (i.e., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 may be different from a signal transmission characteristic through the second horizontal line HL2.

Figure 6:
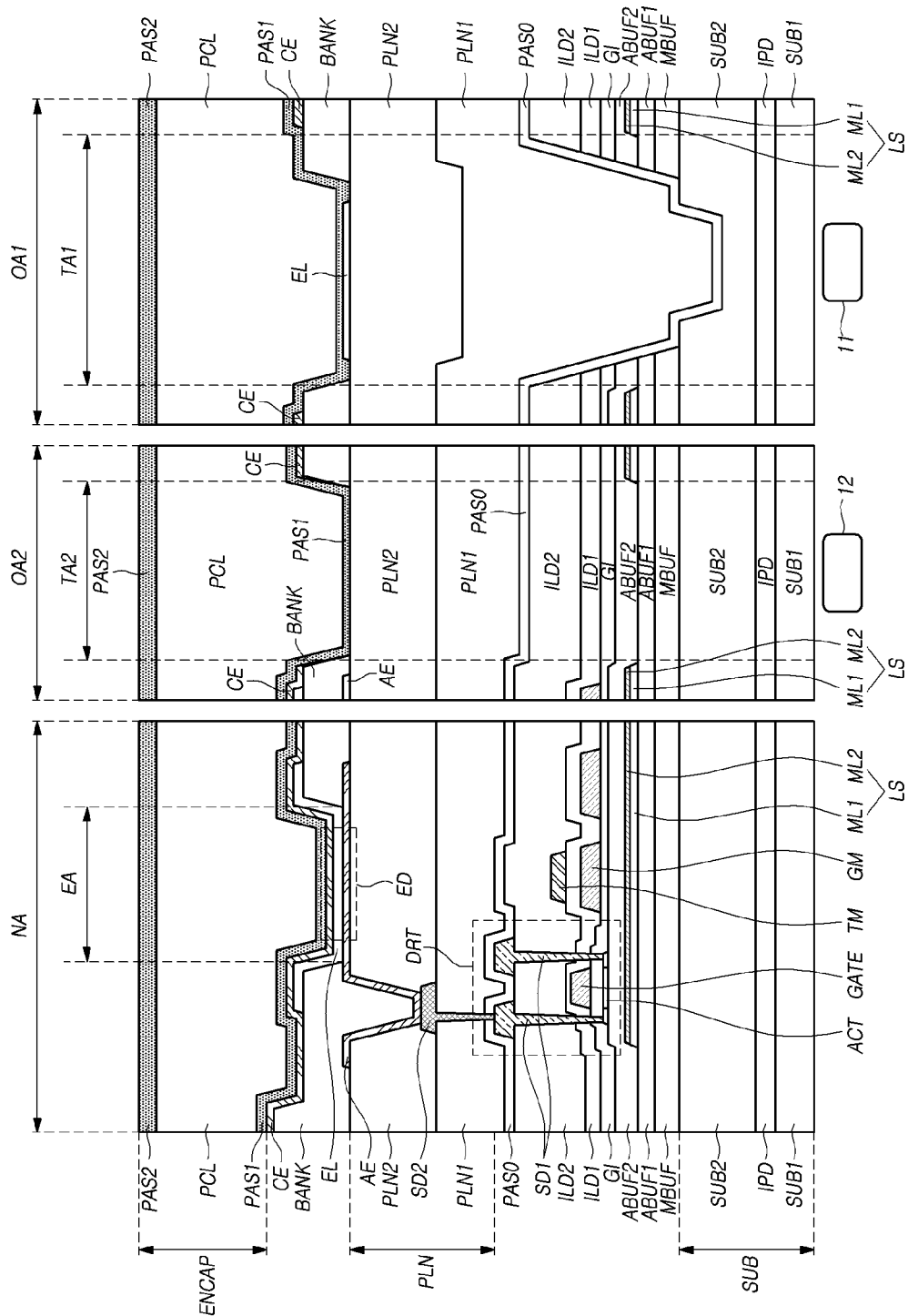
FIGS. 6 and 7 are example cross-sectional views of each of the first optical area, the second optical area, and the normal area included in the display area of the display device according to embodiments of the present disclosure.
Figure 7:
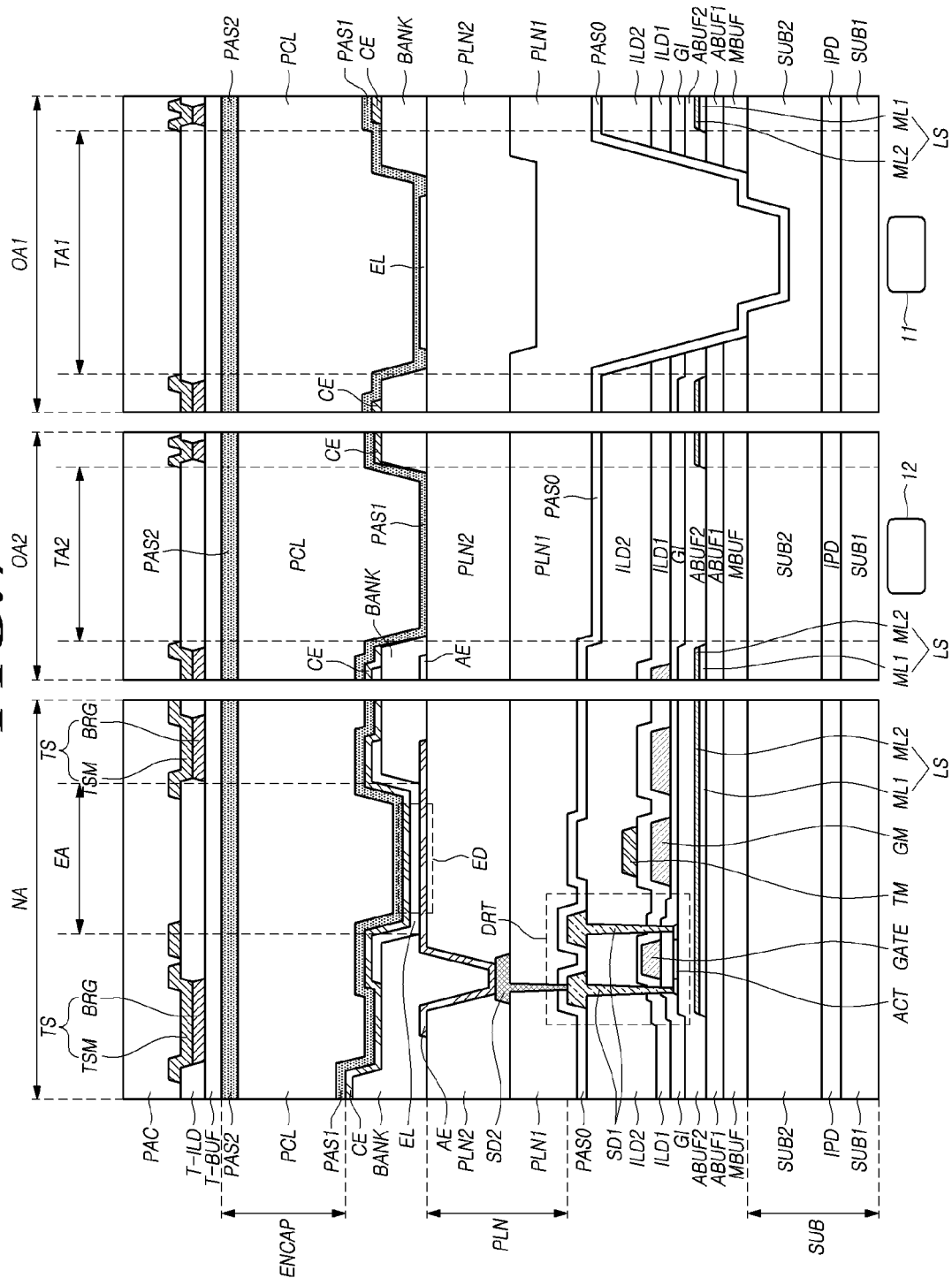

FIGS. 6 and 7 are example cross-sectional views of each of a first optical area (the first optical area OA1 in the figures discussed above), a second optical area (e.g., the second optical area OA2 in the figures discussed above), and a normal area (e.g., the normal area NA in the figures discussed above) included in a display area DA of the display panel PNL according to aspects of the present disclosure.

FIG. 6 illustrates the display panel PNL in an example where a touch sensor is present outside of the display panel PNL in the form of a touch panel according to one embodiment. FIG. 7 illustrates the display panel PNL in an example where a touch sensor TS is present inside of the display panel PNL according to one embodiment.

Each of FIGS. 6 and 7 shows example cross-sectional views of the normal area NA, the first optical area OA1, and the second optical area OA2 included in the display area DA.

First, a stack structure of the normal area NA will be described with reference to FIGS. 6 and 7. Respective light emitting areas EA of the first optical area OA1 and the second optical area OA2 may have the same stack structure as a light emitting area EA of the normal area NA.

Referring to FIGS. 6 and 7, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

Referring to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 may be disposed on or over the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, light shield layers LS for shielding light.

A second active buffer layer ABUF2 may be disposed on the first metal layer ML1 and the second metal layer ML2. An active layer ACT of the driving transistor DRT may be disposed on the second active buffer layer ABUF2.

A gate insulating layer GI may be disposed to cover the active layer ACT.

A gate electrode GATE of the driving transistor DRT may be disposed on the gate insulating layer GI. Further, a gate material layer GM may be disposed on the gate insulating layer GI, together with the gate electrode GATE of the driving transistor DRT, at a location different from the location where the driving transistor DRT is disposed.

A first interlayer insulating layer ILD1 may be disposed to cover the gate electrode GATE and the gate material layer GM. A metal pattern TM may be disposed on the first interlayer insulating layer ILD1. The metal pattern TM may be located at a location different from the location where the driving transistor DRT is formatted. A second interlayer insulating layer ILD2 may be disposed to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other may be a drain node of the driving transistor DRT.

The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE may serve as a channel region. One of the two first source-drain electrode patterns SD1 may be connected to the first side of the channel region of the active layer ACT, and the other of the two first source-drain electrode patterns SD1 may be connected to the second side of the channel region of the active layer ACT.

A passivation layer PAS0 nay be disposed to cover the two first source-drain electrode patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corresponding to the second node N2 of the driving transistor DRT in the subpixel SP of FIG. 3) through a contact hole formed in the first planarization layer PLN1.

The second planarization layer PLN2 may be disposed to cover the second source-drain electrode pattern SD2. A light emitting element ED may be disposed on the second planarization layer PLN2.

According to an example stack structure of the light emitting element ED, an anode electrode AE may be disposed on the second planarization layer PLN2. The anode electrode AE may be electrically connected to the second source-drain electrode pattern SD2 through a contact hole formed in the second planarization layer PLN2.

A bank BANK may be disposed to cover a portion of the anode electrode AE. A portion of the bank BANK corresponding to a light emitting area EA of the subpixel SP may be opened.

A portion of the anode electrode AE may be exposed through an opening (the opened portion) of the bank BANK. An emission layer EL may be disposed on side surfaces of the bank BANK and in the opening (the opened portion) of the bank BANK. All or at least a portion of the emission layer EL may be located between adjacent banks.

In the opening of the bank BANK, the emission layer EL may contact the anode electrode AE. A cathode electrode CE may be disposed on the emission layer EL.

The light emitting element ED can be formed by including the anode electrode AE, the emission layer EL, and the cathode electrode CE, as described above. The emission layer EL may include an organic material layer.

An encapsulation layer ENCAP may be disposed on the stack of the light emitting element ED.

The encapsulation layer ENCAP may have a single-layer structure or a multi-layer structure. For example, as shown in FIGS. 6 and 7, the encapsulation layer ENCAP may include a first encapsulation layer PAS1, a second encapsulation layer PCL, and a third encapsulation layer PAS2.

The first encapsulation layer PAS1 and the third encapsulation layer PAS2 may be, for example, an inorganic material layer, and the second encapsulation layer PCL may be, for example, an organic material layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the light emitting element ED. The first encapsulation layer PAS1 may include an inorganic insulating material capable of being deposited using low-temperature deposition. For example, the first encapsulation layer PAS1 may include, but not limited to, silicon nitride ($SiN_x$), silicon oxide ($SiO_x$), silicon oxynitride (SiON), aluminum oxide ($Al_2O_3$), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL may have a smaller area or size than the first encapsulation layer PAS1. For example, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet scheme.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can reduce or prevent external moisture or oxygen from penetrating into the first encapsulation layer PAS1 and the second encapsulation layer PCL. For example, the third encapsulation layer PAS2 may include an inorganic insulating material, such as silicon nitride ($SiN_x$), silicon oxide ($SiO_x$), silicon oxynitride (SiON), aluminum oxide ($Al_2O_3$), or the like.

Referring to FIG. 7, in an example where a touch sensor TS is embedded into the display panel PNL, the touch sensor TS may be disposed on the encapsulation layer ENCAP. The structure of the touch sensor will be described in detail as follows.

A touch buffer layer T-BUF may be disposed on the encapsulation layer ENCAP. The touch sensor TS may be disposed on the touch buffer layer T-BUF.

The touch sensor TS may include touch sensor metals TSM and at least one bridge metal BRG, which are located in different layers.

A touch interlayer insulating layer T-ILD may be disposed between the touch sensor metals TSM and the bridge metal BRG.

For example, the touch sensor metals TSM may include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM may be electrically connected to each other through the bridge metal BRG located in a different layer. The bridge metal BRG may be electrically insulated from the third touch sensor metal TSM by the touch interlayer insulating layer T-ILD.

While the touch sensor TS is disposed on the display panel PNL, a chemical solution (e.g., a developer or etchant) used in the corresponding process or moisture from the outside may be generated or introduced. In some embodiments, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

In order to prevent or at least reduce damage to the emission layer EL including an organic material, which is vulnerable to high temperatures, the touch buffer layer T-BUF can be formed at a low temperature less than or equal to a predetermined temperature (e.g., 100 degrees ° C.) and be formed using an organic insulating material having a low permittivity of 1 to 3. For example, the touch buffer layer T-BUF may include an acrylic-based, epoxy-based, or silicon-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed to cover the touch sensor TS. The protective layer PAC may be, for example, an organic insulating layer.

Next, a stack structure of the first optical area OA1 will be described with reference to FIGS. 6 and 7.

Referring to FIGS. 6 and 7, the light emitting area EA of the first optical area OA1 may have the same stack structure as that in the normal area NA. Accordingly, in the discussion that follows, instead of repeatedly describing the light emitting area EA of the first optical area OA1, a stack structure of the first transmission area TA1 of the first optical area OA1 will be described in detail below.

In some embodiments, the cathode electrode CE may be disposed in the light emitting areas EA included in the normal area NA and the first optical area OA1, but may not be disposed in the first transmission area TA1 in the first optical area OA1. For example, the first transmission area TA1 of the first optical area OA1 may correspond to an opening of the cathode electrode CE.

Further, in some embodiments, a light shield layer LS including at least one of the first metal layer ML1 and the second metal layer ML2 may be disposed in the light emitting areas EA included in the normal area NA and the first optical area OA1, but may not be disposed in the first transmission area TA1 of the first optical area OA1. For example, the first transmission area TA1 of the first optical area OA1 may correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 may be disposed in the first transmission area TA1 in the first optical area OA1 equally, substantially equally, or similarly.

However, in some embodiments, all, or one or more, of one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1.

For example, referring to FIGS. 6 and 7, all, or one or more, of the metal material layers (ML1, ML2, GATE, GM, TM, SD1, SD2) related to at least one transistor and the semiconductor layer ACT may not be disposed in the first transmission area TA1.

Referring to FIGS. 6 and 7, in some embodiments, the anode electrode AE and the cathode electrode CE included in the light emitting element ED may not be disposed in the first transmission area TA1. In some embodiments, the emission layer EL of the light emitting element ED may or may not be disposed in the first transmission area TA1 according to a design requirement.

Further, referring to FIG. 7, in some embodiments, the touch sensor metal TSM and the bridge metal BRG included in the touch sensor TS may not be disposed in the first transmission area TA1 in the first optical area OA1.

Accordingly, the light transmittance of the first transmission area TA1 in the first optical area OA1 can be provided or improved because the material layers (e.g., one or more metal material layers, and/or one or more semiconductor layers) having electrical properties are not disposed in the first transmission area TA1 in the first optical area OA1. As a consequence, the first optical electronic device 11 can perform a predefined function (e.g., image sensing) by receiving light transmitting through the first transmission area TA1.

In some embodiments, since all, or one or more, of the first transmission area TA1 in the first optical area OA1 overlap the first optical electronic device 11, to enable the first optical electronic device 11 to normally operate, it is desired to further increase a transmittance of the first transmission area TA1 in the first optical area OA1.

To achieve the foregoing, in the display panel PNL of the display device 100 according to aspects of the present disclosure, a transmittance improvement structure TIS may be provided to the first transmission area TA1 of the first optical area OA1.

Referring to FIGS. 6 and 7, the plurality of insulating layers included in the display panel PNL may include at least one buffer layer (MBUF, ABUF1, and/or ABUF2) between at least one substrate (SUB1 and/or SUB2) and at least one transistor (DRT and/or SCT), at least one planarization layers (PLN1 and/or PLN2) between the transistor DRT and the light emitting element ED, at least one encapsulation layer ENCAP on the light emitting element ED, and the like.

Referring to FIG. 7, the plurality of insulating layers included in the display panel PNL may further include the touch buffer layer T-BUF and the touch interlayer insulating layer T-ILD located on the encapsulation layer ENCAP, and the like.

Referring to FIGS. 6 and 7, the first transmission area TA1 in the first optical area OA1 can have a structure in which the first planarization layer PLN1 and the passivation layer PAS0 have depressed portions that extend downward from respective surfaces thereof as a transmittance improvement structure TIS.

Referring to FIGS. 6 and 7, among the plurality of insulating layers, the first planarization layer PLN1 may include at least one depression (e.g., a recess, a trench, a concave portion, a protrusion, or the like). The first planarization layer PLN1 may be, for example, an organic insulating layer.

In the example where the first planarization layer PLN1 has the depressed portion that extends downward from the surfaces thereof, the second planarization layer PLN2 can substantially serve to provide planarization. In one embodiment, the second planarization layer PLN2 may also have a depressed portion that extends downward from the surface thereof. In this embodiment, the second encapsulation layer PCL can substantially serve to provide planarization.

Referring to FIGS. 6 and 7, the depressed portions of the first planarization layer PLN1 and the passivation layer PAS0 may pass through insulating layers, such as the first interlayer insulating layer ILD1, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 6 and 7, the substrate SUB may include at least one concave portion or depressed portion as a transmittance improvement structure TIS. For example, in the first transmission area TA1, an upper portion of the second substrate SUB2 may be indented or depressed downward, or the second substrate SUB2 may be perforated.

Referring to FIGS. 6 and 7, the first encapsulation layer PAS1 and the second encapsulation layer PCL included in the encapsulation layer ENCAP may also have a transmittance improvement structure TIS in which the first encapsulation layer PAS1 and the second encapsulation layer PCL have depressed portions that extend downward from the respective surfaces thereof. The second encapsulation layer PCL may be, for example, an organic insulating layer.

Referring to FIG. 7, to protect the touch sensor TS, the protective layer PAC may be disposed to cover the touch sensor TS on the encapsulation layer ENCAP.

Referring to FIG. 7, the protective layer PAC may have at least one depression (e.g., a recess, a trench, a concave portion, a protrusion, or the like) as a transmittance improvement structure TIS in a portion overlapping the first transmission area TA1. The protective layer PAC may be, for example, an organic insulating layer.

Referring to FIG. 7, the touch sensor TS may include one or more touch sensor metals TSM with a mesh type. In the example where the touch sensor metal TSM is formed in the mesh type, a plurality of openings may be formed in the touch sensor metal TSM. Each of the plurality of openings may be located to correspond to the light emitting area EA of the subpixel SP.

In order for the first optical area OA1 to have a transmittance greater than the normal area NA, an area or size of the touch sensor metal TSM per unit area in the first optical area OA1 may be smaller than an area or size of the touch sensor metal TSM per unit area in the normal area NA.

Referring to FIG. 7, in some embodiments, the touch sensor TS may be disposed in the light emitting area EA in the first optical area OA1, but may not be disposed in the first transmission area TA1 in the first optical area OA1.

Next, a stack structure of the second optical area OA2 will be described with reference to FIGS. 6 and 7.

Referring to FIGS. 6 and 7, the light emitting area EA of the second optical area OA2 may have the same stack structure as that of the normal area NA. Accordingly, in the discussion that follows, instead of repeatedly describing the light emitting area EA in the second optical area OA2, a stack structure of the second transmission area TA2 in the second optical area OA2 will be described in detail below.

In some embodiments, the cathode electrode CE may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the cathode electrode CE.

In an embodiment, the light shield layer LS including at least one of the first metal layer ML1 and the second metal layer ML2 may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the light shield layer LS.

In an example where the transmittance of the second optical area OA2 and the transmittance of the first optical area OA1 are the same, the stack structure of the second transmission area TA2 in the second optical area OA2 may be the same as the stacked structure of the first transmission area TA1 in the first optical area OA1.

In another example where the transmittance of the second optical area OA2 and the transmittance of the first optical area OA1 are different, the stack structure of the second transmission area TA2 in the second optical area OA2 may be different at least in part from as the stacked structure of the first transmission area TA1 in the first optical area OA1.

For example, as shown in FIGS. 6 and 7, in some embodiments, when the transmittance of the second optical area OA2 is less than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed. In an embodiment, a width of the second transmission area TA2 in the second optical area OA2 may be smaller than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 may be disposed in the second transmission area TA2 of the second optical area OA2 equally, substantially equally, or similarly.

However, in some embodiments, all, or one or more, of one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2 in the second optical area OA2.

For example, referring to FIGS. 6 and 7, all, or one or more, of the metal material layers (ML1, ML2, GATE, GM, TM, SD1, SD2) related to at least one transistor and the semiconductor layer ACT may not be disposed in the second transmission area TA2 in the second optical area OA2.

Further, referring to FIGS. 6 and 7, in some embodiments, the anode electrode AE and the cathode electrode CE included in the light emitting element ED may not be disposed in the second transmission area TA2. In some embodiments, the emission layer EL of the light emitting element ED may or may not be disposed in the second transmission area TA2 of the second optical area OA2.

Further, referring to FIG. 7, in some embodiments, the touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., one or more metal material layers, and/or one or more semiconductor layers) having electrical properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

Figure 8:
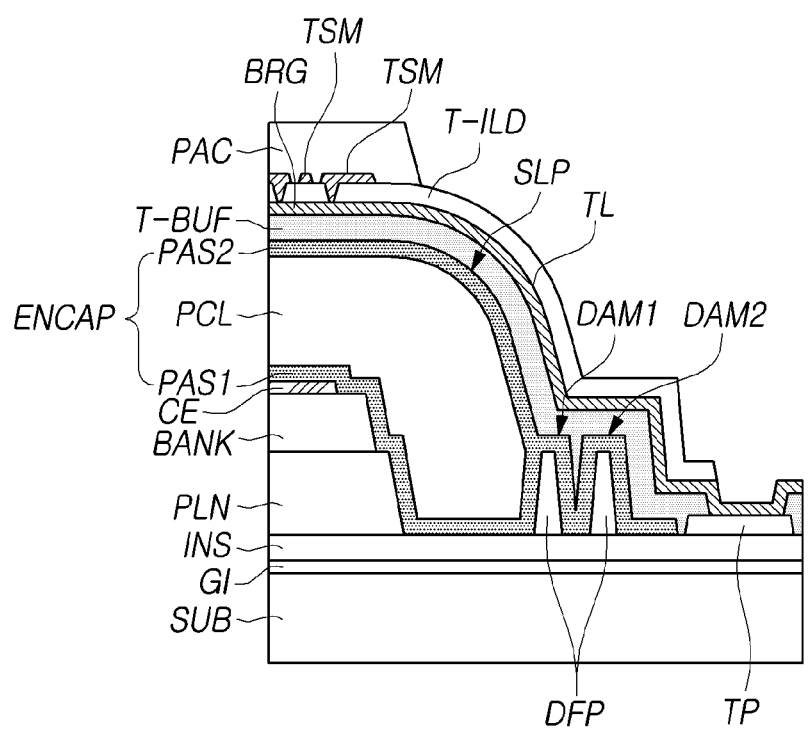
FIG. 8 is an example cross-sectional view of an edge of a display panel according to embodiments of the present disclosure.

FIG. 8 is an example cross-sectional view of an edge of the display panel PNL according to embodiments of the present disclosure.

For the sake of brevity, in FIG. 8, a single substrate SUB including the first substrate SUB1 and the second substrate SUB2 is illustrated, and layers or portions located under the bank BANK are illustrated in a simplified structure. In the same manner, FIG. 8 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 8, the first encapsulation layer PAS1 may be disposed on the cathode electrode CE and disposed closest to the light emitting element ED. The second encapsulation layer PCL may have a smaller area or size than the first encapsulation layer PAS1. For example, the second encapsulation layer PCL may be disposed to expose both ends or edges of the first encapsulation layer PAS1.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1.

The third encapsulation layer PAS2 can minimize or prevent external moisture or oxygen from penetrating into the first encapsulation layer PAS1 and the second encapsulation layer PCL.

Referring to FIG. 8, in order to prevent or at least reduce the encapsulation layer ENCAP from collapsing, the display panel PNL may include one or more dams (DAM1 and/or DAM2) at, or near to, an end or edge of an inclined surface SLP of the encapsulation layer ENCAP. The one or more dams (DAM1 and/or DAM2) may be present at, or near to, a boundary point between the display area DA and the non-display area NDA.

The one or more dams (DAM1 and/or DAM2) may include the same material DFP as the bank BANK.

Referring to FIG. 8, in one embodiment, the second encapsulation layer PCL including an organic material may be located only on an inner side of a first dam DAM1, which is located closest to the inclined surface SLP of the encapsulation layer ENCAP among the dams. For example, the second encapsulation layer PCL may not be located on all of the dams (DAM1 and DAM2). In another embodiment, the second encapsulation layer PCL including an organic material may be located on at least the first dam DAM1 of the first dam DAM1 and a second dam DAM2.

For example, the second encapsulation layer PCL may extend only up to all, or at least a portion, of an upper portion of the first dam DAM1. In further another embodiment, the second encapsulation layer PCL may extend past the upper portion of the first dam DAM1 and extend up to all, or at least a portion of, an upper portion of the secondary dam DAM2.

Referring to FIG. 8, a touch pad TP, to which the touch driving circuit TDC, as shown in FIG. 2, is electrically connected, may be disposed on a portion of the substrate SUB outside of the one or more dams (DAM1 and/or DAM2).

A touch line TL can electrically connect, to the touch pad TP, the touch sensor metal TSM or the bridge metal BRG included in, or serving as, a touch electrode disposed in the display area DA.

One end or edge of the touch line TL may be electrically connected to the touch sensor metal TSM or the bridge metal BRG, and the other end or edge of the touch line TL may be electrically connected to the touch pad TP.

The touch line TL may run downward along the inclined surface SLP of the encapsulation layer ENCAP, run along the respective upper portions of the one or more dams (DAM1 and/or DAM2), and extend up to the touch pad TP disposed outside of the one or more dams (DAM1 and/or DAM2).

Referring to FIG. 8, in one embodiment, the touch line TL may be the bridge metal BRG. In another embodiment, the touch line TL may be the touch sensor metal TSM.

Figure 9:
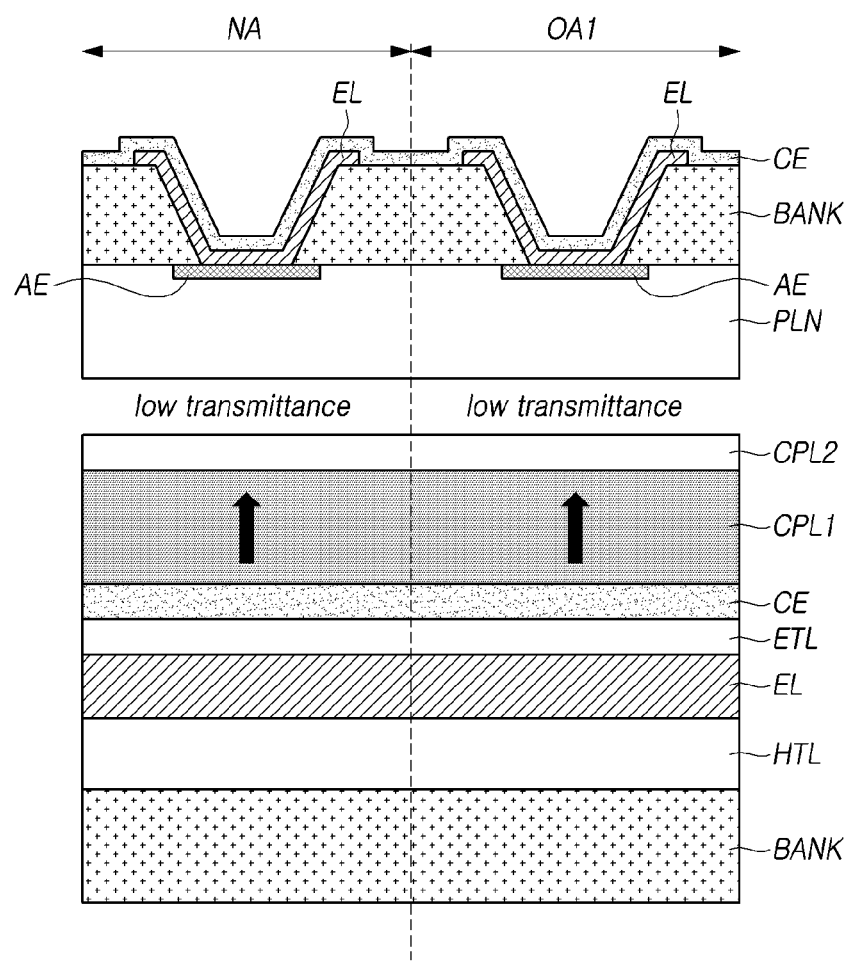
FIG. 9 is a cross-sectional view of a display device according to a comparative example.

FIG. 9 is a cross-sectional view of a display device according to a comparative example.

Referring to FIG. 9, the display device according to the comparative example may include a normal area NA and a first optical area OA1, and include a bank BANK, a hole transport layer HTL, an emission layer EL, and an electron transport layer ETL, a cathode electrode CE, a first capping layer CPL1, and a second capping layer CPL2.

An anode electrode AE may be located on a planarization layer PLN, and the bank BANK may be located on the anode electrode AE. The emission layer EL may be located on the bank BANK, and the cathode electrode CE may be located on the emission layer EL.

Accordingly, the first capping layer CPL1 and the second capping layer CPL2 may be disposed on a light emitting element, such as a light emitting diode, including the anode electrode AE, the emission layer EL, and the cathode electrode CE. The first capping layer CPL1 and the second capping layer CPL2 can protect the light emitting element, and further improve the efficiency of the light emitting element through micro cavities.

In the display device according to the comparative example, each of the first capping layer CPL1 and the second capping layer CPL2 may be formed as a same single layer in both of the normal area NA and the first optical area OA1. When the first capping layer CPL1 and the second capping layer CPL2 located in the first optical area OA1 are the same as the first capping layer CPL1 and the second capping layer CPL2 located in the normal area NA, respectively, the first capping layer CPL1 and the second capping layer CPL2 may low light transmittance.

Figure 10:
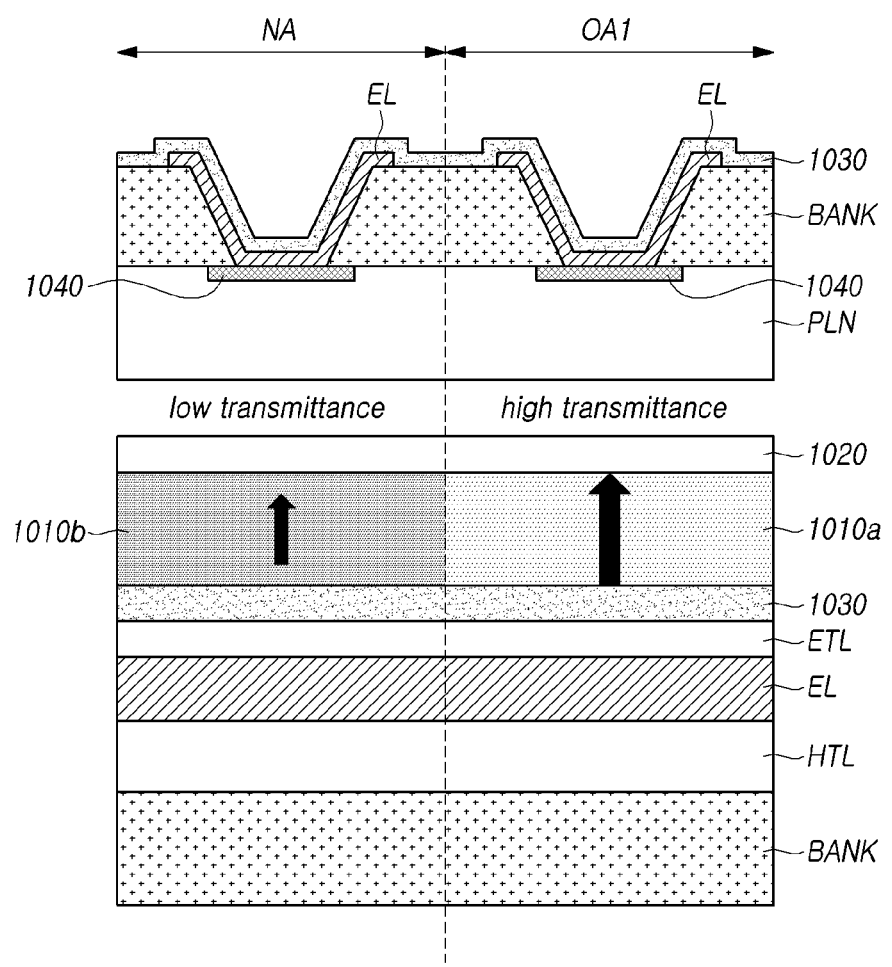
FIGS. 10 and 11 are example cross-sectional views of a display device according to embodiments of the present disclosure.

FIG. 10 is a cross-sectional view of a display device (e.g., the display device 100 in the figures discussed above) according to embodiments of the present disclosure.

Referring to FIG. 10, the display device according to embodiments of the present disclosure may include a display area including a first optical area OA1 and a normal area NA located outside of the first optical area OA1, at least one light emitting element such as a light emitting diode, and a first capping layer (1010a and 1010b) located on the light emitting element.

The light emitting element may be located on a bank BANK. The bank BANK may be a layer defining a pixel area, and a light emitting area of a subpixel may be defined by the bank BANK.

The light emitting element may include a hole transport layer HTL, an emission layer EL, an electron transport layer ETL, a first electrode 1030, and a second electrode 1040.

The first capping layer (1010a and 1010b) may be located on the first electrode 1030. A second capping layer 1020 may be located on the first capping layer (1010a and 1010b).

The first electrode 1030 may be a common electrode. The first electrode 1030 may be a cathode electrode or an anode electrode. In the embodiment illustrated in FIG. 10, the first electrode 1030 may be a cathode electrode.

The second electrode 1040 may be a pixel electrode. The second electrode 1040 may be a cathode electrode or an anode electrode. In the embodiment illustrated in FIG. 10, the second electrode 1040 may be an anode electrode.

One or more of the thicknesses and refractive indexes of portions of the first capping layer (1010a and 1010b) respectively located in the first optical area OA1 and the normal area NA may be different from each other. The first capping layer (1010a and 1010b) may be, for example, an organic capping layer, of which the thickness and refractive index can be easily adjusted. The types of organic materials included in the first capping layer (1010a and 1010b) are not particularly limited.

In a situation where the first capping layer (1010a and 1010b) is an organic capping layer, and the refractive index of a portion 1010a of the first capping layer located in the first optical area OA1 is greater than that of a portion 1010b of the first capping layer located in the normal area NA, a high transmittance can be more easily achieved in the first optical area OA1. In an example where the first capping layer is an inorganic capping layer including an inorganic material as a main component, there may arise a problem in which a haze phenomenon may occur while achieving a higher refractive index. In an example where the first capping layer is an inorganic capping layer formed by a deposition process, it may be difficult to control the thickness of the first capping layer 1010. In particular, forming a thick inorganic capping layer by the deposition process may take time and cause an increased cost due to the characteristics of the deposition process.

The refractive index of a portion 1010a of the first capping layer located in the first optical area OA1 may be different from the refractive index of a portion 1010b of the first capping layer located in the normal area NA. For example, the refractive index of the portion 1010a of the first capping layer located in the first optical area OA1 may be higher than that of the portion 1010b of the first capping layer located in the normal area NA. In an example where the refractive index of the portion 1010a of the first capping layer located in the first optical area OA1 is higher than that of the portion 1010b of the first capping layer located in the normal area NA, the first optical area OA1 may have a higher transmittance. Accordingly, in an example where an optical electronic device is located in the first optical area OA1, the optical electronic device can receive a larger amount of light, this leading the optical electronic device to operate more effectively.

The portion 1010a of the first capping layer located in the first optical area OA1 may include one or more different materials from the portion 1010b of the first capping layer located in the normal area NA. In these examples, the refractive index of the portion 1010a of the first capping layer located in the first optical area OA1 may be different from that of the portion 1010b of the first capping layer located in the normal area NA. For example, the refractive index of the portion 1010a of the first capping layer located in the first optical area OA1 may be higher than that of the portion 1010b of the first capping layer located in the normal area NA.

The second capping layer 1020 may be located on the first capping layer (1010a and 1010b). The second capping layer 1020 may be an inorganic capping layer including an inorganic material. For example, the second capping layer 1020 may include one or more of $SiO_x$, $SiON_x$, and $Si_3N_4$.

The first capping layer (1010a and 1010b) may have a greater thickness than the second capping layer 1020. In an example where the first capping layer (1010a and 1010b) is an organic capping layer, and the second capping layer 1020 is an inorganic capping layer, since increasing the thickness of the organic capping layer is more advantageous compared with increasing the thickness of the inorganic capping layer, to improve the efficiency of a corresponding light emitting element taking account of the micro cavity phenomenon, the first capping layer (1010a and 1010b) may be designed to have a greater thickness than the second capping layer 1020 when designing the entire thickness of the capping layer. When the first capping layer (1010a and 1010b), which is the organic capping layer, is configured to have a greater thickness than the second capping layer 1020, which is the inorganic capping layer, the cost and time required for manufacturing the display device may be reduced.

The portion 1010a of the first capping layer located in the first optical area OA1 may have substantially the same thickness as the portion 1010b of the first capping layer located in the normal area NA. For example, the thickness of the portion 1010a of the first capping layer located in the first optical area OA1 may be substantially the same as the thickness of the portion 1010b of the first capping layer located in the normal area NA, and the refractive index of the portion 1010a of the first capping layer located in the first optical area OA1 may be higher than the refractive index of the portion 1010b of the first capping layer located in the normal area NA. In these embodiments, the display device may have a higher transmittance in the first optical area OA1.

Figure 11:
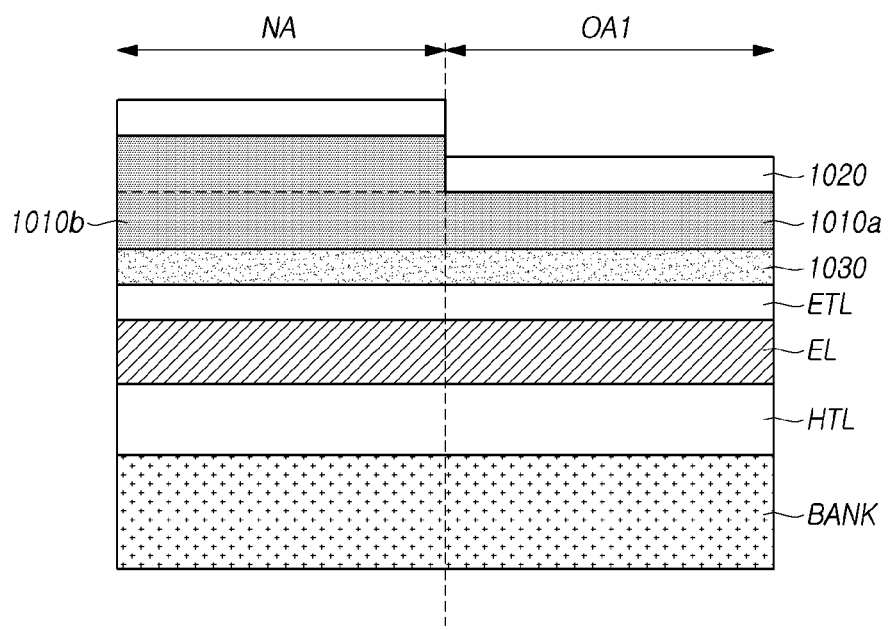

FIG. 11 is a cross-sectional view of the display device (e.g., the display device 100 in the figures discussed above) according to embodiments of the present disclosure.

Referring to FIG. 11, the thickness of a portion 1010a of the first capping layer (1010a and 1010b) located in the first optical area OA1 may be smaller than that of a portion 1010b of the first capping layer (1010a and 1010b) located in the normal area NA. As such, in the example where the thickness of the portion 1010a of the first capping layer located in the first optical area OA1 is less than a thickness of the portion 1010b of the first capping layer located in the normal area NA, the display device can have a higher transmittance in the first optical area OA1.

In embodiments where the thickness of the portion 1010a of the first capping layer located in the first optical area OA1 is less than that of the portion 1010b of the first capping layer located in the normal area NA, a method of manufacturing the first capping layer (1010a and 1010b) may include a step of forming the first capping layer (1010a and 1010b) in common in the first optical area OA1 and the normal area NA in such a manner that the first capping layer (1010a and 1010b) has a thickness in common in the first optical area OA1 and the normal area NA. Through the foregoing step, the number of used masks can be reduced, and thereby, the cost of the manufacturing process can be reduced, compared with an example of manufacturing the portion 1010a of the capping layer located in the first optical area OA1 using one mask and manufacturing the portion 1010b of the capping layer located in the normal area NA using another mask.

The portion 1010a of the first capping layer located in the first optical area OA1 may include substantially the same one or more materials as the portion 1010b of the first capping layer located in the normal area NA. For example, the first capping layer (1010a and 1010b) may include the same material in the portion 1010a thereof in the first optical area OA1 and the portion 1010b thereof in the normal area NA, and the thickness of the portion 1010a thereof in the first optical area OA1 may be smaller than that of the portion 1010b thereof in the normal area NA.

The thickness and refractive index of the portion 1010a of the first capping layer in the first optical area OA1 may be different from the thickness and refractive index of the portion 1010b of the first capping layer in the normal area NA, respectively. For example, the thickness of the portion 1010a of the first capping layer in the first optical area OA1 may be smaller than the thickness of the portion 1010b of the first capping layer in the normal area NA, and the refractive index of the portion 1010a of the first capping layer in the first optical area OA1 may be higher than the refractive index of the portion 1010b of the first capping layer in the normal area NA. As such, in the example where the first capping layer (1010a and 1010b) have a thinner thickness and a higher refractive index in the first optical area OA1 compared with the normal area NA, the first optical area OA1 can have a higher transmittance.

Figure 12:
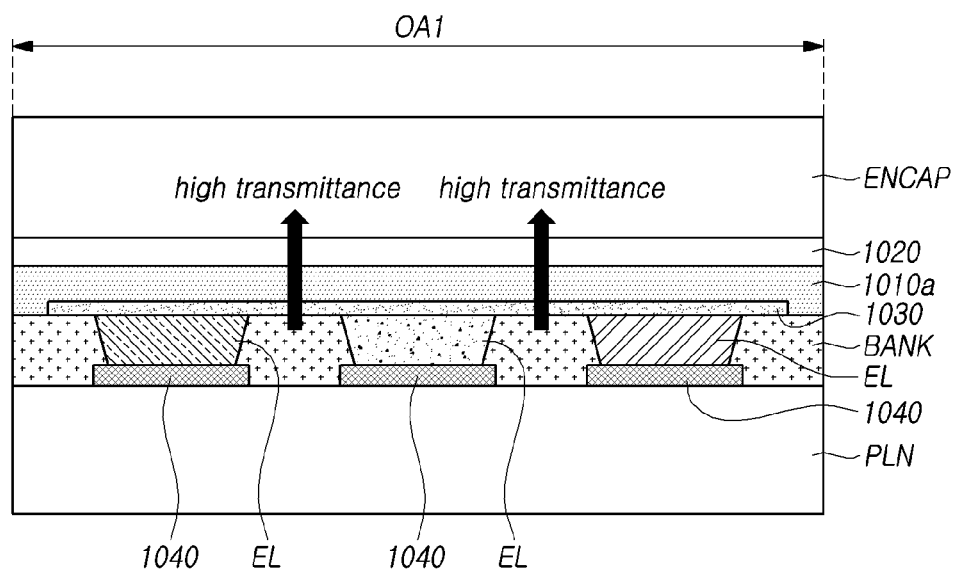
FIG. 12 is an example cross-sectional view of a first optical area of the display device according to embodiments of the present disclosure.

FIG. 12 is an example cross-sectional view of a first optical area (e.g., the first optical area OA1 in the figures discussed above) of the display device according to embodiments of the present disclosure.

Referring to FIG. 12, in the display device according to aspects of the present disclosure, the transmittance of a bank BANK in the first optical area OA1 can be improved. As described above, such a transmittance improvement can be achieved when one or more of the thicknesses and refractive indexes of portions (1010a and 1010b) of the first capping layer respectively located in the first optical area OA1 and the normal area NA are different from each other. Accordingly, in examples where an optical electronic device such as a camera is located in the first optical area OA1, the optical electronic device can receive light more effectively.

Each of one or more light emitting elements disposed in the display device may include a first electrode 1030, a second electrode 1040, and an emission layer EL located between the first electrode 1030 and the second electrode 1040. The first electrode 1030 may be a common electrode, and the second electrode 1040 may be a pixel electrode.

The first electrode 1030 may be located closer to the first capping layer 1010a than the second electrode 1040. For example, the second electrode 1040 may be located underneath the emission layer EL, the first electrode 1030 may be located on the emission layer EL, and the first capping layer 1010a may be located on the first electrode 1030.

A portion of the first electrode 1030 located in the first optical area OA1 may have substantially the same thickness as a portion of the first electrode 1030 located in the normal area NA. In some embodiments, to increase the transmittance of the first optical area OA1, without configuring the portion of the first electrode 1030 located in the first optical area OA1 to have a smaller thickness than the portion of the first electrode 1030 located in the normal area NA, the portion of the first electrode 1030 located in the first optical area OA1 may be designed to have substantially the same thickness as the portion of the first electrode 1030 located in the normal area NA. In some embodiments, even if the first electrode 1030 does not have a small thickness, the first optical area OA1 can have a high transmittance by allowing one or more of the thicknesses and refractive indexes of portions (1010a and 1010b) of the first capping layer respectively located in the first optical area and the normal area NA to be different from each other. According to embodiments of the present disclosure, the display device can prevent the durability of light emitting elements against UV rays from being deteriorated by reducing the thickness of the first electrode 1030 in the first optical area OA1.

Figure 13:
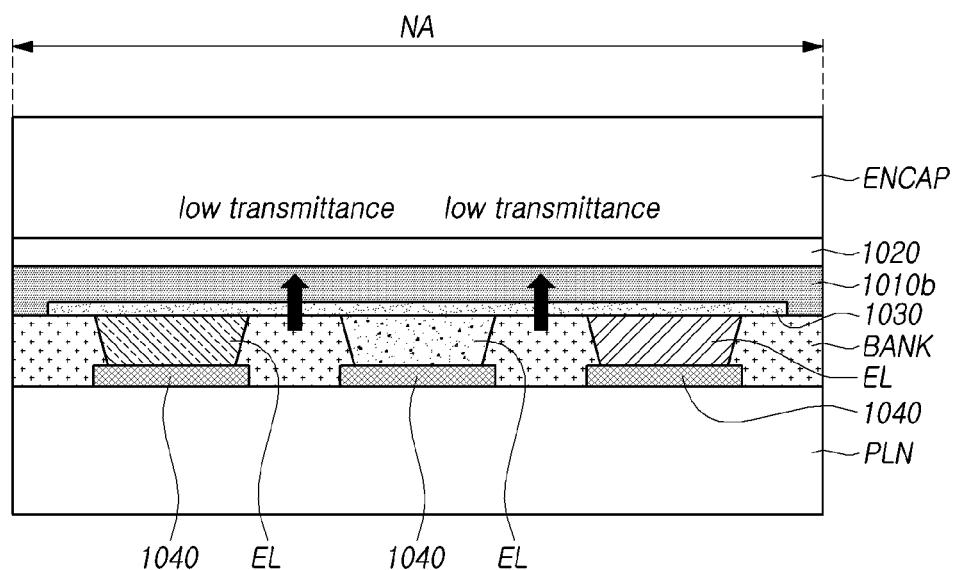
FIG. 13 is an example cross-sectional view of a normal area of the display device according to embodiments of the present disclosure.

FIG. 13 is an example cross-sectional view of a normal area (e.g., the normal area NA in the figures discussed above) the of the display device according to aspects of the present disclosure.

Referring to FIG. 13, in the display device according to embodiments of the present disclosure, the transmittance of a portion of a bank BANK located in the normal area NA may be relatively lower than the transmittance of a portion of the bank BANK located in the first optical area OA1. This may be because one or more of the thicknesses and refractive indexes of portions (1010a and 1010b) of the first capping layer respectively located in the first optical area OA1 and the normal area NA are different from each other. Since an optical electronic device such as a camera is not disposed under, or in a lower portion of, the normal area NA, even if the transmittance of the normal area NA is lower than that of the first optical area, the transmittance of the normal area NA may not be problematic.

Figure 14:
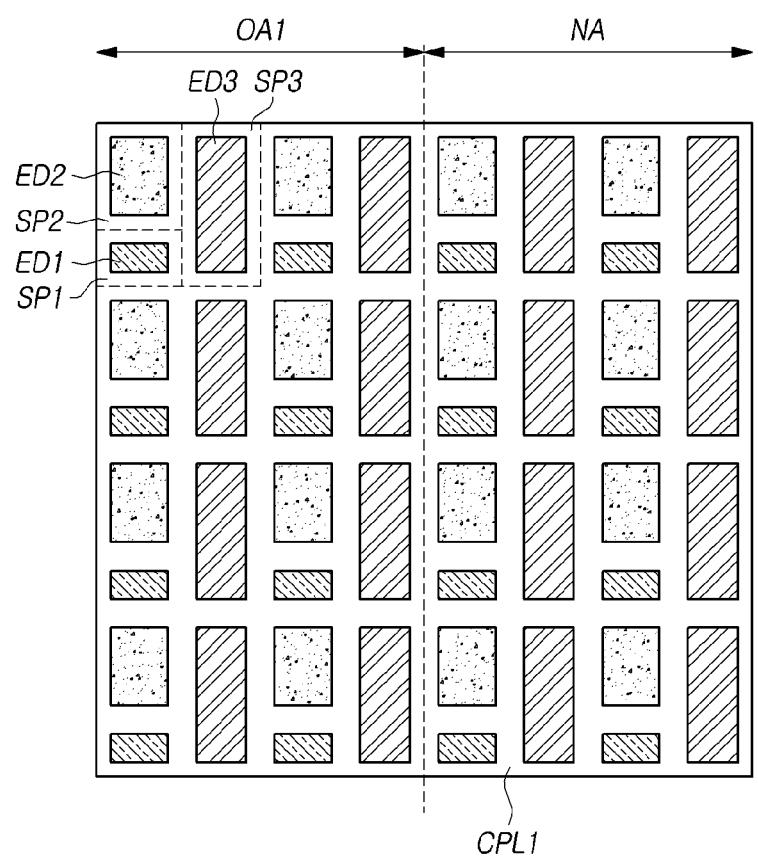
FIG. 14 is a plan view of a display device according to a comparative example.

FIG. 14 is a plan view of a display device according to a comparative example.

Referring to FIG. 14, a plurality of light emitting elements may be located in the first optical area OA1 and the normal area NA. The plurality of light emitting element may include a first light emitting element ED1, a second light emitting element ED2, and a third light emitting element ED3.

Each of the light emitting elements may include a subpixel. A first subpixel SP1 may include the first light emitting element ED1, a second subpixel SP2 may include the second light emitting element ED2, and a third subpixel SP3 may include the third light emitting element.

In the comparative example illustrated in FIG. 14, both the first optical area OA1 and the normal area NA may include the same capping layer. For example, the first capping layer CPL1 of the comparative example may have the same thickness and refractive index in both the first optical area OA1 and the normal area NA.

Figure 15:
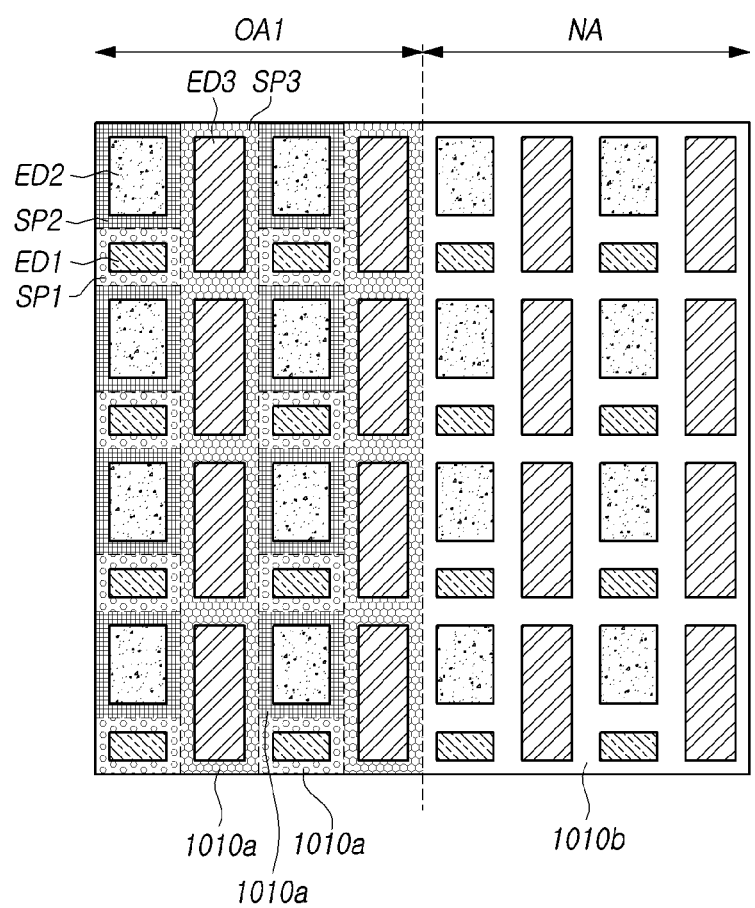
FIG. 15 is a plan view of a display device according to embodiments of the present disclosure.

FIG. 15 is a plan view of a display device (e.g., the display device 100 in the figures discussed above) according to embodiments of the present disclosure.

Referring to FIG. 15, a first capping layer (1010a and 1010b) configured to allow one or more of the thicknesses and refractive indexes of respective portions (1010a and 1010b) located in the first optical area OA1 and the normal area NA to be different from each other may be located in each subpixel. For example, one or more of respective thicknesses and refractive indexes of a first capping layer 1010a of a first subpixel SP1 in which a first light emitting element ED1 is located, a first capping layer 1010a of a second subpixel SP2 in which a second light emitting element ED2 is located, and a first capping layer 1010a of a third subpixel SP3 in which a third light emitting element ED3 is located may be different from one another. In these embodiments, the first capping layer (1010a and 1010b) can have a refractive index and thickness capable of maximizing light efficiency through micro cavities for light emitted by the first light emitting element ED1, the second light emitting element ED2, and the third light emitting element ED3. Further, in these embodiments, at least one of the thickness and the refractive index of the first capping layer 1010a located in the first optical area OA1 may be different from at least one of the thickness and the refractive index of the first capping layer 1010b located in the normal area NA, respectively.

The first light emitting element ED1 may be a red light emitting element, the second light emitting element ED2 may be a green light emitting element, and the third light emitting element ED3 may be a blue light emitting element.

FIG. 16 illustrates respective transmittances of a display device (e.g., the display device 100 in the figures discussed above) according to an embodiment of the present disclosure and a display device according to a comparative example. The comparative example has a structure as illustrated in FIG. 9, and the embodiment includes the same configuration as the comparative example except that the thickness of a first capping layer in the first optical area is thinner than the thickness of a first capping layer in the comparative example, and the refractive index of the first capping layer in the first optical area is higher than the refractive index of the first capping layer in the comparative example.

Referring to FIG. 16, it can be seen that, compared with the comparative example, the embodiment has more excellent transmittances in all of a red light emitting element, a green light emitting element, and a blue light emitting element.

Figure 17:
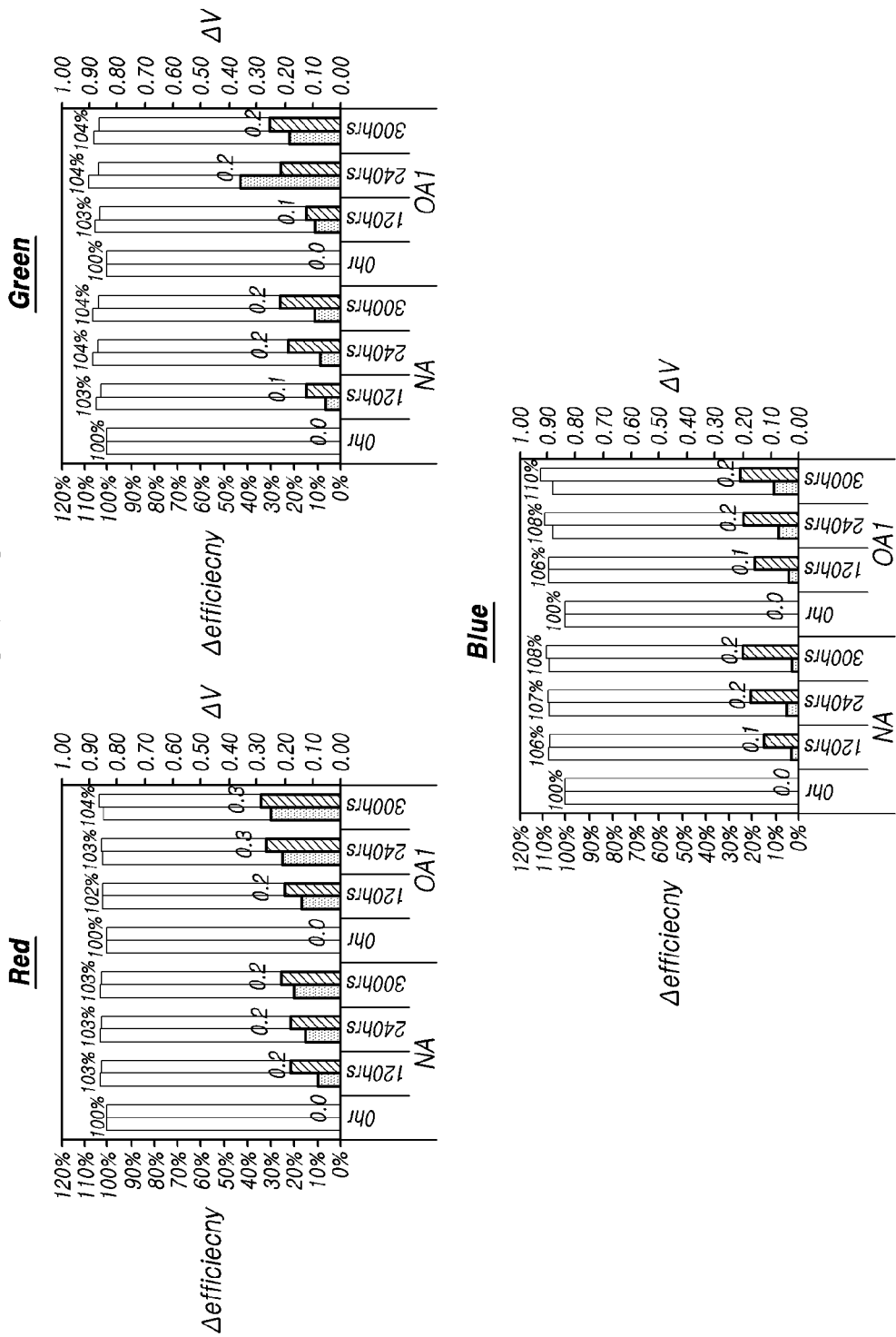
FIG. 17 illustrates measurement related to the reliability of the display device according to aspects of the present disclosure.

FIG. 17 illustrates measurement related to the reliability of the display device according to aspects of the present disclosure. FIG. 17 illustrates a result of measuring the durability of the first optical area OA1 and the normal area NA against UV light in the display device according to aspects of the present disclosure.

Referring to FIG. 17, it can be seen that all of a red light emitting element, a green light emitting element, and a blue light emitting element do not have a significant difference in reliability against UV light in the first optical area OA1 and the normal area NA. As described above, in the embodiments of the present disclosure, in order to achieve a high transmittance, without forming the first electrode such that a portion of the first electrode, which is the common electrode and located on the emission layer, in the first optical area has a smaller thickness than a portion of the first electrode in the normal area, since the first electrode is formed with substantially the same thickness in the respective portions, this leading the light emitting elements to have excellent durability even in the first optical area.

The embodiments described above will be briefly described as follows.

Embodiments of the present disclosure provide a display device (e.g., the display device 100 in the figures discussed above) including a display area DA, at least one light emitting element ED, and a first capping layer (1010a and 1010b).

The display area DA includes a first optical area OA1 and a normal area NA located outside of the first optical area OA1.

The first capping layer (1010a and 1010b) is disposed on the light emitting element ED. One or more of the thicknesses and refractive indexes of portions of the first capping layer (1010a and 1010b) respectively located in the first optical area OA1 and the normal area NA may be different from each other.

The first capping layer (1010a and 1010b) may be, for example, an organic capping layer.

The display device 100 may include a second capping layer 1020 that is located on the first capping layer (1010a and 1010b) and be an inorganic capping layer.

The first capping layer (1010a and 1010b) may have a greater thickness than the second capping layer 1020.

The light emitting element ED may include a first electrode 1030, a second electrode 1040, and an emission layer EL located between the first electrode 1030 and the second electrode 1040.

The first electrode 1030 may be located closer to the first capping layer (1010a and 1010b) than the second electrode 1040. A portion of the first electrode 1030 located in the first optical area OA1 may have substantially the same thickness as a portion of the first electrode 1030 located in the normal area NA.

The thickness of a portion 1010a of the first capping layer (1010a and 1010b) located in the first optical area OA1 may be smaller than that of a portion 1010b of the first capping layer (1010a and 1010b) located in the normal area NA.

The portion 1010a of the first capping layer located in the first optical area OA1 may include substantially the same one or more materials as the portion 1010b of the first capping layer located in the normal area NA.

The refractive index of the portion 1010a of the first capping layer located in the first optical area OA1 may be higher than that of the portion 1010b of the first capping layer located in the normal area NA.

The portion 1010a of the first capping layer located in the first optical area OA1 may include one or more different materials from the portion 1010b of the first capping layer located in the normal area NA.

The portion 1010a of the first capping layer located in the first optical area OA1 may have substantially the same thickness as the portion 1010b of the first capping layer located in the normal area NA.

A first light emitting element ED1 and a second light emitting element ED2, which emit light of different colors, may be disposed in the first optical area OA1.

The first capping layer (1010a and/or 1010b) may include a first area corresponding to the first light emitting element ED1 and a second area corresponding to the second light emitting element ED2, and one or more of respective thicknesses and refractive indexes of the first and second areas may be different from each other.

The above description has been presented to enable any person skilled in the art to make, use and practice the technical features of the present invention, and has been provided in the context of a particular application and its requirements as examples. Various modifications, additions and substitutions to the described embodiments will be readily apparent to those skilled in the art, and the principles described herein may be applied to other embodiments and applications without departing from the scope of the present invention. The above description and the accompanying drawings provide examples of the technical features of the present invention for illustrative purposes only. That is, the disclosed embodiments are intended to illustrate the scope of the technical features of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device comprising:
    a display area comprising a first optical area and a normal area that is located outside of the first optical area;
    at least one light emitting element; and
    a first capping layer on the at least one light emitting element,
    wherein at least one of thicknesses and refractive indexes of respective portions of the first capping layer located in the first optical area and the normal area are different from each other, and
    wherein a portion of the first capping layer in the first optical area has a thickness that is less than a thickness of a portion of the first capping layer in the normal area.

2. The display device according to claim 1, wherein the first capping layer is an organic capping layer.

3. The display device according to claim 1, further comprising:
    a second capping layer on the first capping layer, wherein the second capping layer is an inorganic capping layer.

4. The display device according to claim 3, wherein a thickness of the first capping layer is greater than a thickness of the second capping layer.

5. The display device according to claim 1, wherein the portion of the first capping layer in the first optical area has a same material as the portion of the first capping layer in the normal area.

6. The display device according to claim 1, wherein the at least one light emitting element comprises a first light emitting element and a second light emitting element, which emit light of different colors, and
    wherein at least one of respective thicknesses and refractive indexes of a first area corresponding to the first light emitting element and a second area corresponding to the second light emitting element is different from each other.

7. The display device according to claim 1, wherein the first optical area has a resolution, a subpixel arrangement structure, a number of subpixels per unit area, an electrode structure, a line structure, an electrode arrangement structure, and a line arrangement structure that is different from a resolution, a subpixel arrangement structure, a number of subpixels per unit area, an electrode structure, a line structure, an electrode arrangement structure, and a line arrangement structure of the normal area.

8. The display device according to claim 7, wherein the number of subpixels per unit area in the first optical area is less than the number of subpixels per unit area in the normal area.

9. The display device according to claim 1, wherein a size of each subpixel in the first optical area is smaller than a size of each subpixel disposed in the normal area.

10. The display device according to claim 1, wherein the display area includes horizontal lines and vertical lines extending through the first optical area while avoiding transmission areas in the first optical area.

11. A display device comprising:
a display area comprising a first optical area and a normal area that is located outside of the first optical area;
at least one light emitting element; and
a first capping layer on the at least one light emitting element,
wherein at least one of thicknesses and refractive indexes of respective portions of the first capping layer located in the first optical area and the normal area are different from each other,
wherein the at least one light emitting element comprises a first electrode, a second electrode, and an emission layer between the first electrode and the second electrode, and
wherein the first electrode is located closer to the first capping layer than the second electrode, and a portion of the first electrode in the first optical area has a same thickness as a portion of the first electrode in the normal area.

12. A display device comprising:
a display area comprising a first optical area and a normal area that is located outside of the first optical area;
at least one light emitting element; and
a first capping layer on the at least one light emitting element,
wherein at least one of thicknesses and refractive indexes of respective portions of the first capping layer located in the first optical area and the normal area are different from each other, and
wherein a portion of the first capping layer in the first optical area has a refractive index that is greater than a refractive index of a portion of the first capping layer in the normal area.

13. The display device according to claim 12, wherein the portion of the first capping layer in the first optical area has a different material than the portion of the first capping layer in the normal area.

14. The display device according to claim 12, wherein the portion of the first capping layer in the first optical area has a same thickness as the portion of the first capping layer in the normal area.

15. The display device according to claim 12, wherein the first capping layer is an organic capping layer.

16. The display device according to claim 12, further comprising:
a second capping layer on the first capping layer, wherein the second capping layer is an inorganic capping layer.

17. The display device according to claim 16, wherein a thickness of the first capping layer is greater than a thickness of the second capping layer.

* * * * *